US010141297B1

(12) United States Patent
Jain et al.

(10) Patent No.: US 10,141,297 B1
(45) Date of Patent: Nov. 27, 2018

(54) INTEGRATED DEVICE COMPRISING DEVICE LEVEL CELLS WITH VARIABLE SIZES FOR HEAT DISSIPATION AROUND HOTSPOTS

(71) Applicant: QUALCOMM Incorporated, San Diego, CA (US)

(72) Inventors: Palkesh Jain, Bangalore (IN); Mehdi Saeidi, San Diego, CA (US); Jon James Anderson, Boulder, CO (US); Chethan Swamynathan, Bangalore (IN); Richard Wunderlich, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/830,173

(22) Filed: Dec. 4, 2017

(51) Int. Cl.
*H01L 27/02* (2006.01)
*G06F 17/50* (2006.01)

(52) U.S. Cl.
CPC ...... *H01L 27/0211* (2013.01); *G06F 17/5072* (2013.01)

(58) Field of Classification Search
None
See application file for complete search history.

(56) References Cited

U.S. PATENT DOCUMENTS

| | | | |
|---|---|---|---|
| 9,177,866 B2 | 11/2015 | Davies | |
| 9,208,276 B1 | 12/2015 | Tsao et al. | |
| 9,548,302 B2 | 1/2017 | Tsao et al. | |
| 9,601,568 B2 | 3/2017 | Zhao et al. | |
| 9,634,001 B2 | 4/2017 | Wann et al. | |
| 2007/0195501 A1* | 8/2007 | Hoivik | H01L 23/3733 361/708 |
| 2017/0351785 A1* | 12/2017 | Dhanwada | G06F 17/505 |

OTHER PUBLICATIONS

Ansys, "Thermal Solutions for 3-D IC, Packages and System", Technical Paper, 2013.*
Sankaranarayanan, K. "Thermal Modeling and Management of Microprocessor", University of Virginia, School of Engineering and Applied Science, Dissertation, May 2009.*
Lee, S., et. al., "Hot Spot Cooling and Harvesting CPU Waste Heat Using Thermoelectric Modules", Proceedings of the ASME 2014 International Mechanical Engineering Congress and Exposition, IMECE2014, Nov. 14-12, 2014 Montreal Canada.*

* cited by examiner

*Primary Examiner* — Joseph Schoenholtz
(74) *Attorney, Agent, or Firm* — Loza & Loza, LLP/Qualcomm

(57) ABSTRACT

An integrated device that includes a substrate, a device level layer formed over the substrate, and interconnect portion over the device level layer. The device level layer includes a plurality of first device level cells, each first device level cell comprising a first configuration. The device level layer includes a plurality of second device level cells. At least one second device level cell includes a second configuration that is different than the first configuration. The plurality of second device level cells is located over at least one region of the integrated device comprising at least one hotspot.

34 Claims, 19 Drawing Sheets

PLAN VIEW

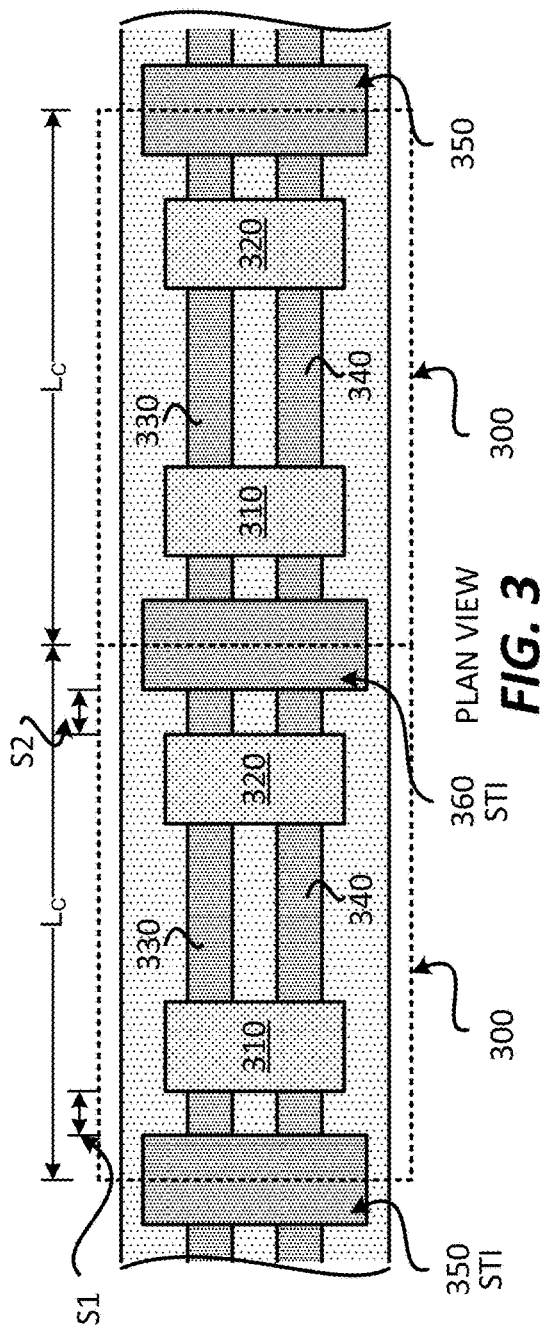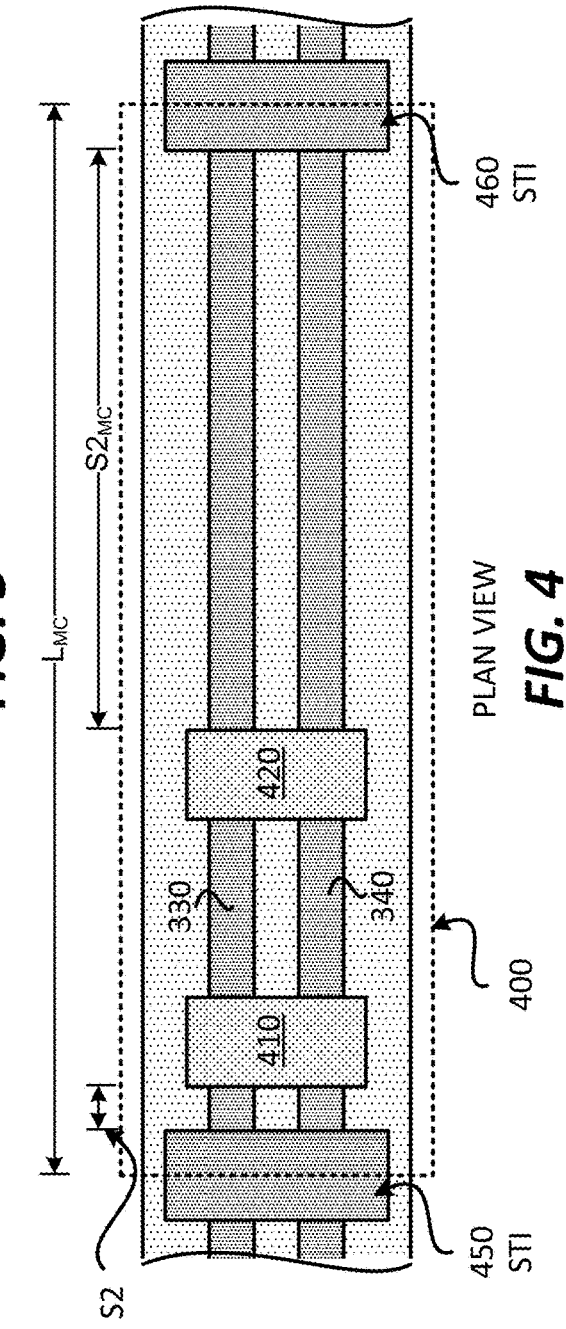

PLAN VIEW

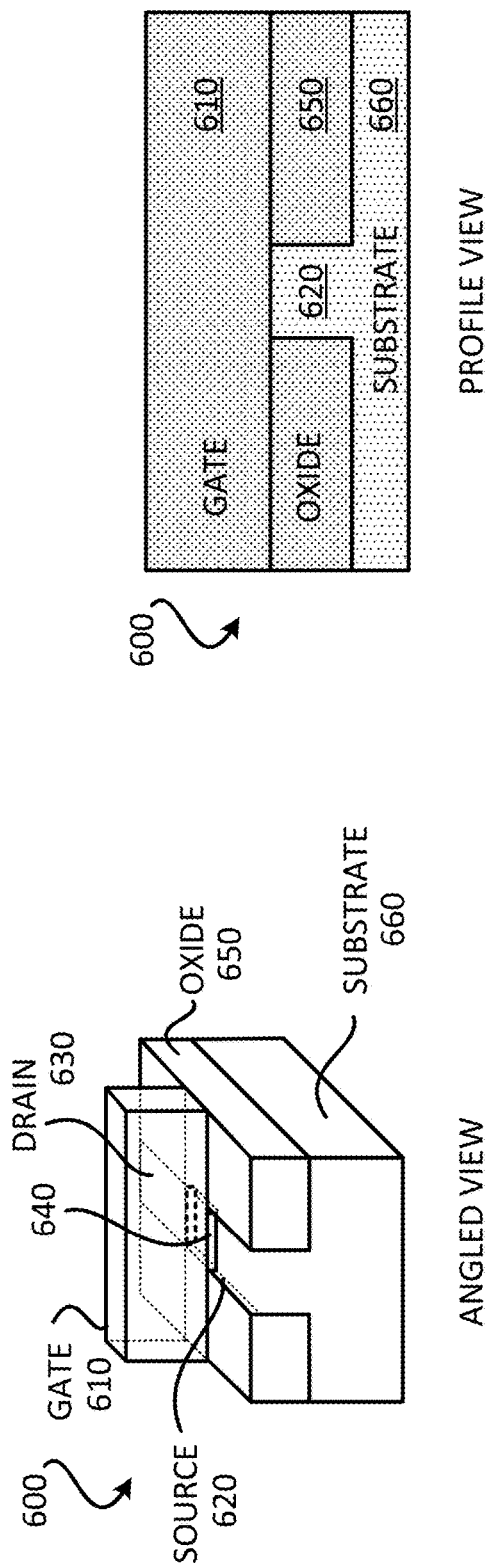
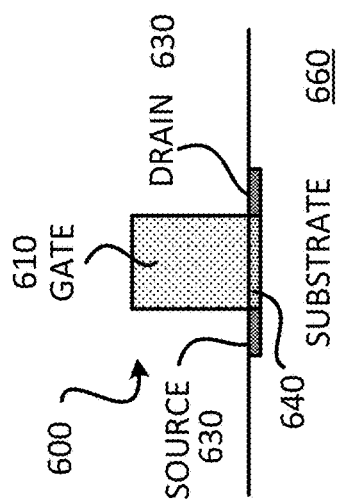
FIG. 7
FIG. 6
FIG. 8

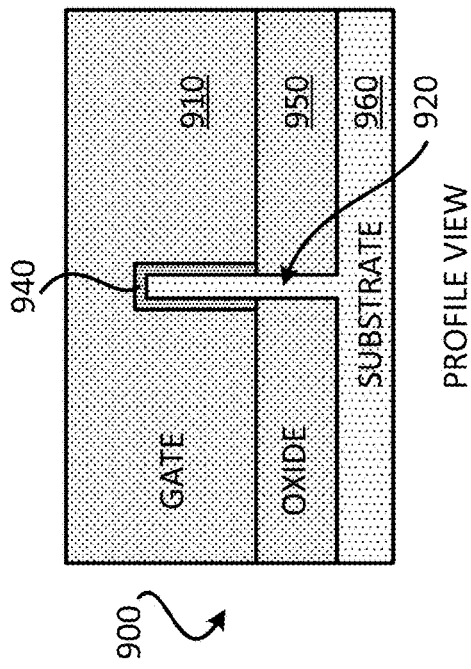
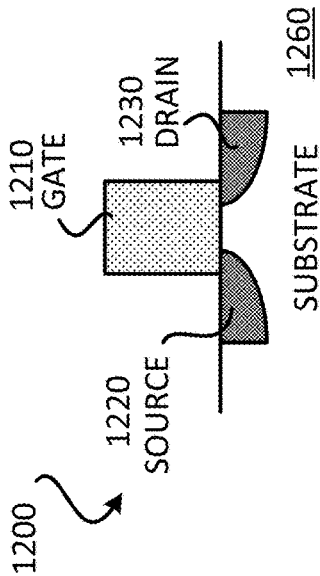
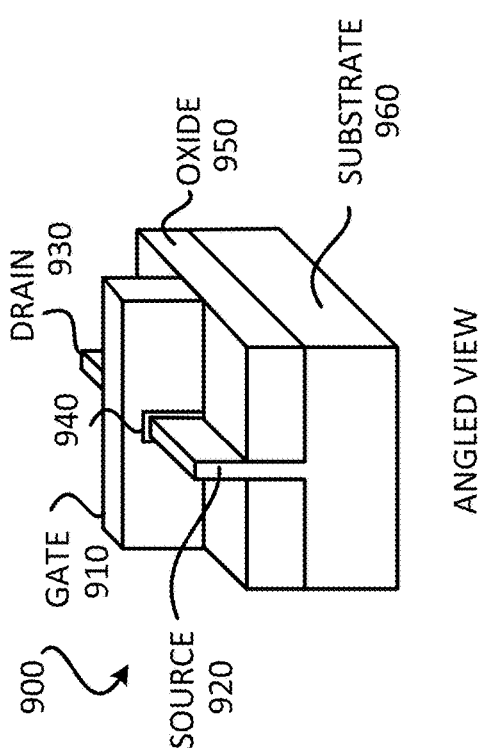
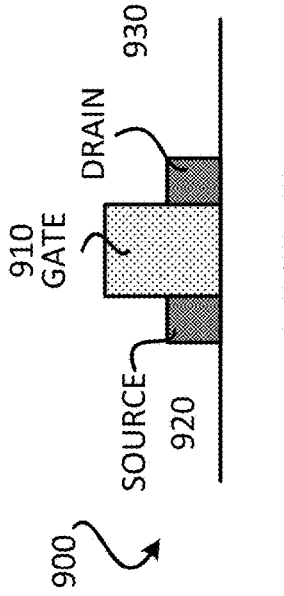

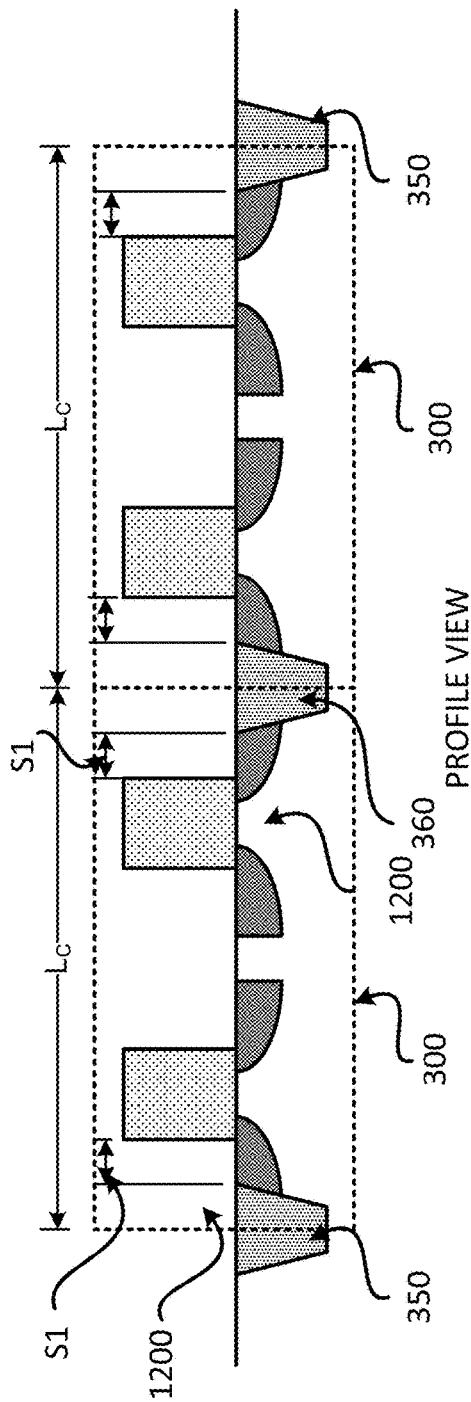
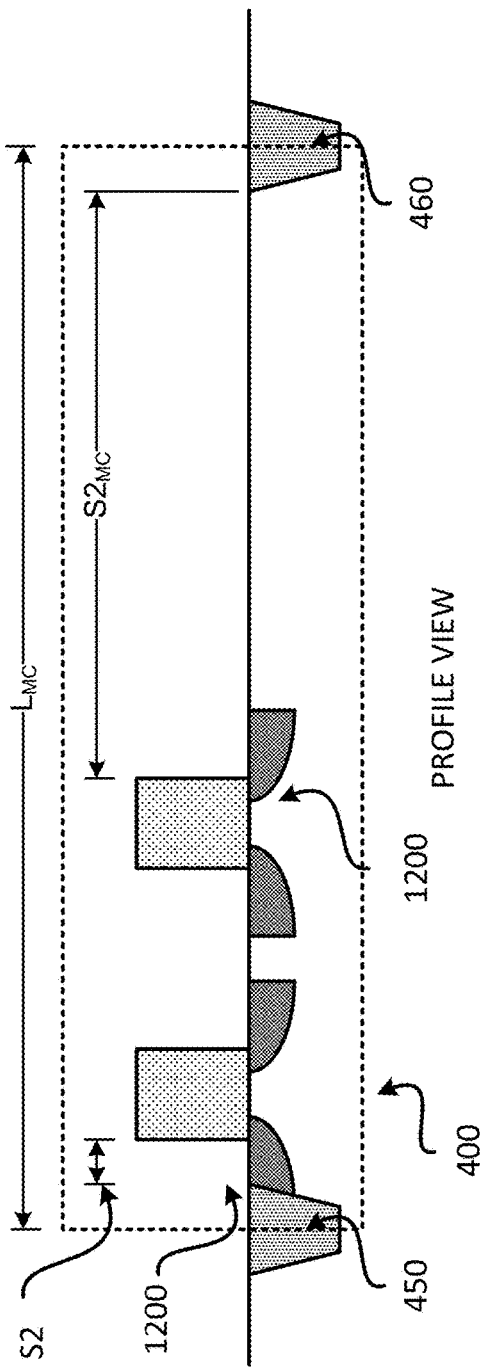

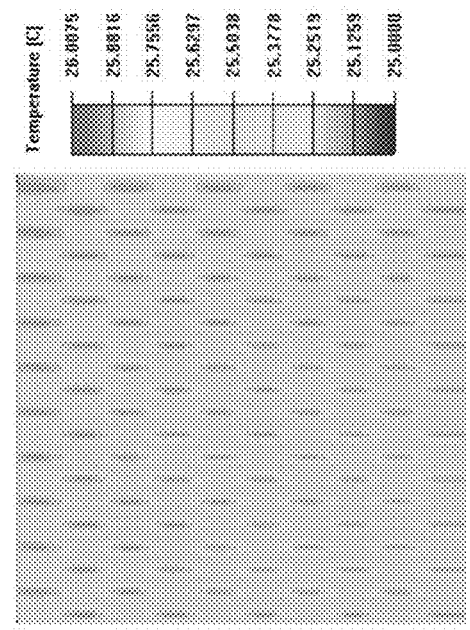
PORTION OF INTEGRATED DEVICE COMPRISING MODIFIED DEVICE LEVEL CELLS
TEMPERATURE RISE: 0.48X
TEMP. DISTRIBUTION STANDARD DEVIATION: 0.091
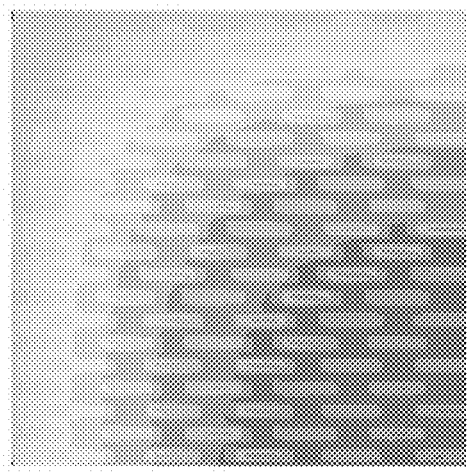
PORTION OF INTEGRATED DEVICE COMPRISING ONLY STANDARD DEVICE LEVEL CELLS
TEMPERATURE RISE: X
TEMP. DISTRIBUTION STANDARD DEVIATION: 0.119
*FIG. 26*

INTEGRATED DEVICE COMPRISING DEVICE LEVEL CELLS WITH VARIABLE SIZES FOR HEAT DISSIPATION AROUND HOTSPOTS

BACKGROUND

Field

Various features relate to integrated devices, but more specifically to integrated devices comprising device level cells with variable sizes for heat dissipation around one or more hotspots.

Background

FIG. 1 illustrates an integrated device 100 that includes a plurality of device level cells 102. Each of these device level cells may include one or more active devices of an integrated device. As shown in FIG. 1, the plurality of device level cells 102 are uniform. That is, each device level cell from the plurality of device level cells 102 have the same shape and size. This design greatly simplifies the integrated device 100, but can be problematic for the integrate device 100.

As more and more device level cells 102 are packed together, heat (e.g., hotspots) in the integrated device 100 becomes an issue. As such, there is an ongoing need to provide an integrated device with improved heat control and/or improved heat dissipation, which would allow the integrated device to perform and operate more efficiently and/or with improved performance.

SUMMARY

Various features relate to integrated devices, but more specifically to integrated devices comprising device level cells with variable sizes for heat dissipation around one or more hotspots.

One example provides an integrated device that includes a substrate, a device level layer formed over the substrate, and an interconnect portion over the device level layer. The device level layer includes a plurality of first device level cells, each first device level cell comprising a first configuration. The device level layer includes a plurality of second device level cells. At least one second device level cell includes a second configuration that is different than the first configuration. The plurality of second device level cells is located over at least one region of the integrated device comprising at least one hotspot.

One example provides a design layout for an integrated device. The design layout includes a plurality of first device level cells, each first device level cell comprising a first configuration. The design layout includes a plurality of second device level cells, at least one second device level cell comprising a second configuration that is different than the first configuration, wherein the plurality of second device level cells is located over at least one region of the integrated device comprising at least one hotspot.

One example provides a method for specifying a design layout for an integrated device. The method specifies a plurality of standard device level cells for the integrated device. The method identifies one or more potential hotpots of the integrated device. The method replaces one of more standard device level cells around the identified potential hotpots with one or more modified device level cells.

BRIEF DESCRIPTION OF THE DRAWINGS

Various features, nature and advantages may become apparent from the detailed description set forth below when taken in conjunction with the drawings in which like reference characters identify correspondingly throughout.

FIG. 3 illustrates a plan view of two neighboring device level cells for an integrated device.

FIG. 4 illustrates a plan view of a modified device level cell for an integrated device.

FIG. 6 illustrates an angled view of a planar FinFET that may be implemented in a device level cell.

FIG. 7 illustrates a profile view of a planar FinFET that may be implemented in a device level cell.

FIG. 8 illustrates another profile view of a planar FinFET that may be implemented in a device level cell.

FIG. 9 illustrates an angled view of a FinFET that may be implemented in a device level cell.

FIG. 10 illustrates a profile view of a FinFET that may be implemented in a device level cell.

FIG. 11 illustrates another profile view of a FinFET that may be implemented in a device level cell.

FIG. 12 illustrates a profile view of an active device that may be implemented in a device level cell.

FIG. 17 illustrates a profile view of two neighboring device level cells for an integrated device, where the device level cells include active devices.

FIG. 18 illustrates a profile view of a modified device level cell for an integrated device, where the device level cell includes active devices.

FIG. 26 illustrates two temperature distribution models for regions of an integrated device.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes an integrated device that includes a substrate, a device level layer formed over the substrate, and an interconnect portion over the device level layer. The device level layer includes a plurality of first device level cells, each first device level cell comprising a first configuration. The device level layer includes a plurality of second device level cells. At least one second device level cell includes a second configuration that is different than the first configuration. The plurality of second device level cells is located over at least one region of the integrated device comprising at least one hotspot. In some implementations, a hotspot may be defined as a region of the integrated device that has a temperature of at least about 95 degrees Celsius (C) when the integrated device is operating. In some implementations, a hotspot may be defined as a region of the integrated device that has a temperature that is at least about in the $95^{th}$ percentile of temperatures for a plurality of regions of the integrated device. In some implementations, the plurality of first device level cells are standard device level cells that represent between about 90 percent and 99.999 percent of all device level cells of the integrated device.

Figure 1:
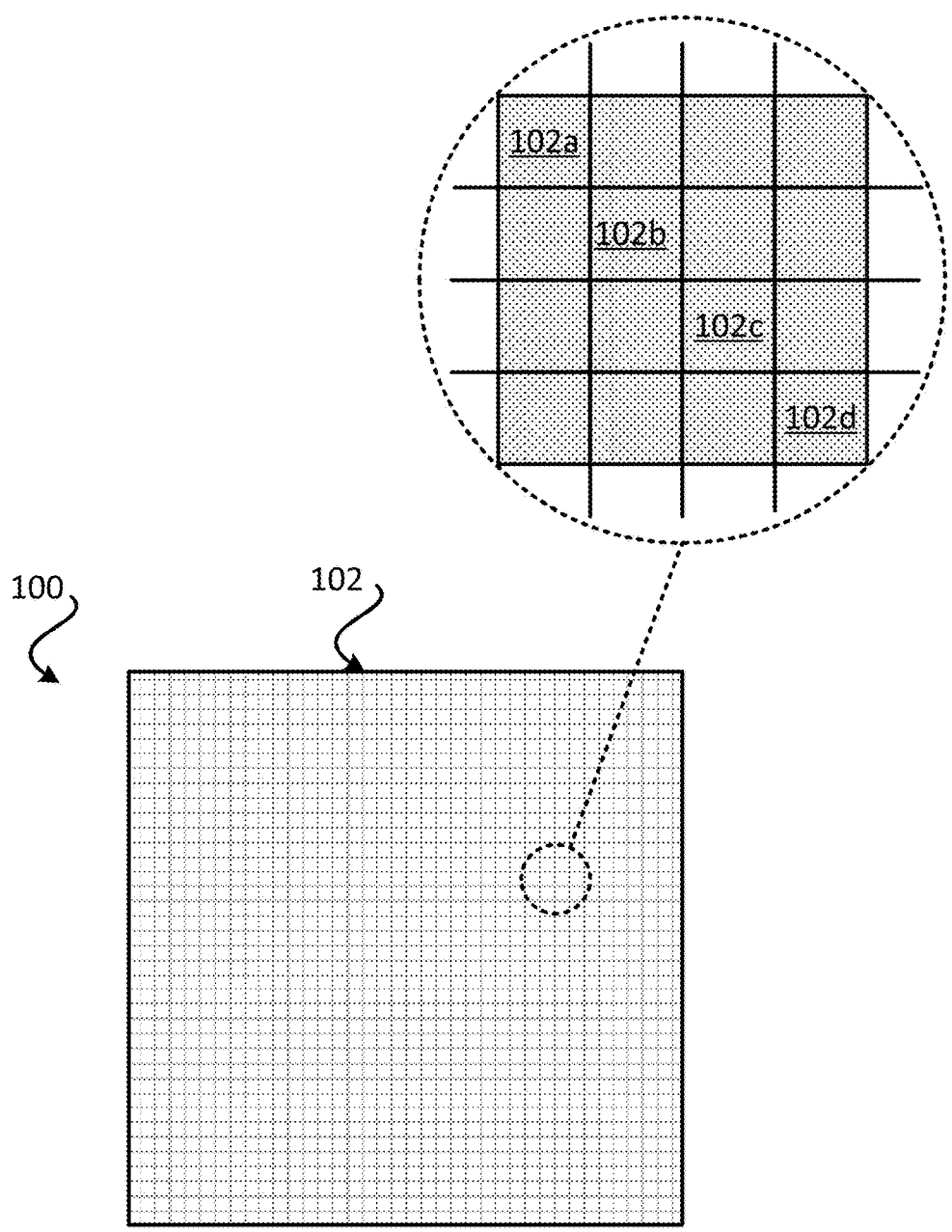
FIG. 1 illustrates a plan view of an integrated device that includes uniform device level cells.
Figure 2:
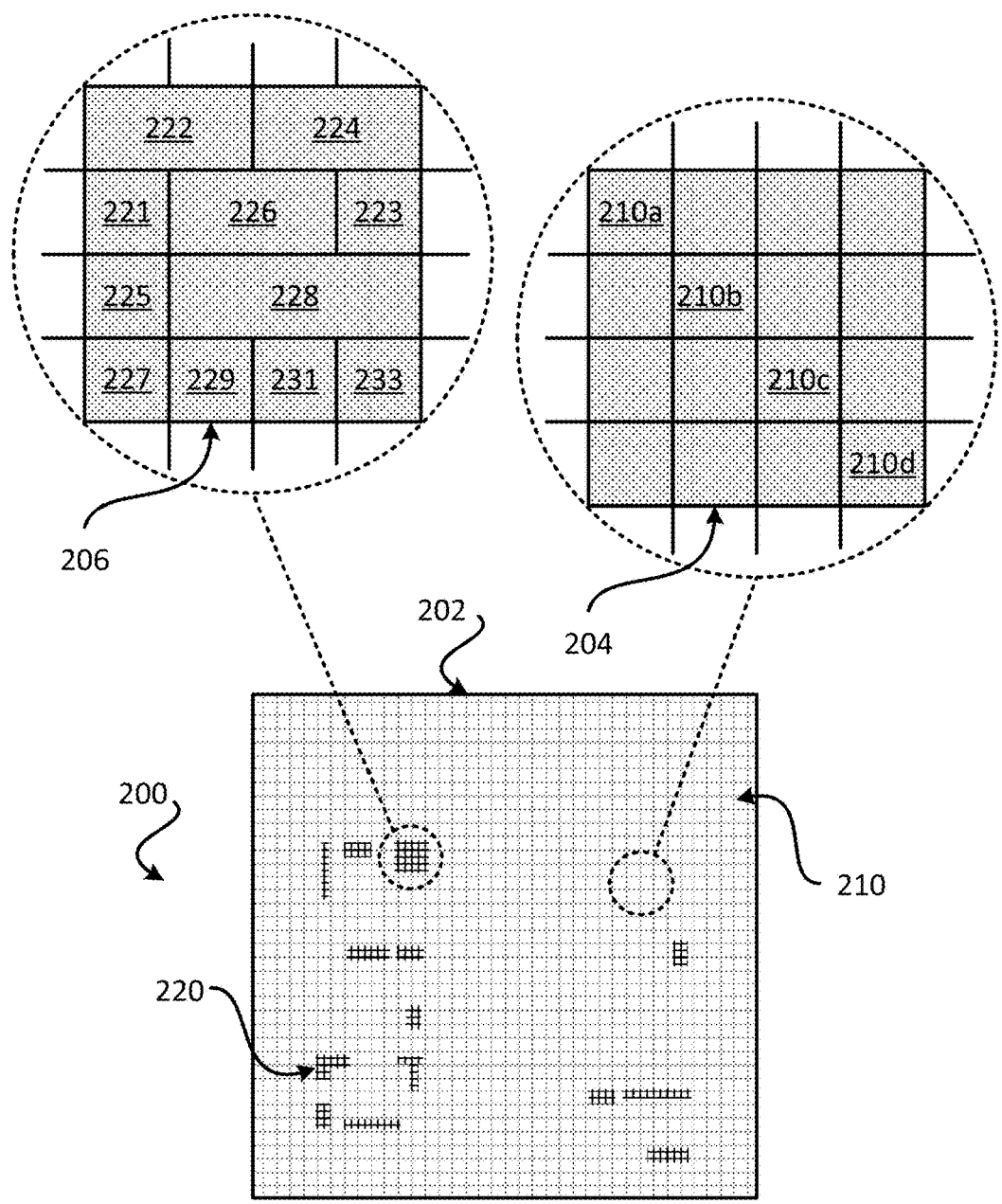
FIG. 2 illustrates a plan view of an integrated device that includes device level cells with different sizes.

Exemplary Integrated Device Comprising Device Level Cells with Different Sizes Around Hotspots of the Integrated Device FIG. 2 illustrates a plan view across a device level layer of an integrated device 200. An example of a profile view of an integrated device that includes a device level layer is illustrated and further described below in FIG. 19. The device level layer includes a plurality of device level cells 202. The plurality of device level cells 202 may be arranged in rows and columns of device level cells. The plurality of device level cells 202 includes active devices (e.g., device level transistors). The plurality of device level cells 202 includes a plurality of first device level cells 210 (e.g., 210a, 210b, 210c, 210d, 221, 223, 225, 227, 227, 229, 231, 233) and a plurality of second device level cells 220 (e.g., 222, 224, 226, 228). The plurality of first device level cells 210 may be standard device level cells. The plurality of second device level cells 220 may be modified device level cells (e.g., non-standard device level cells). Standard device level cells and modified device level cells will be further described below.

The plurality of first device level cells 210 includes a first device level cell that comprises a first configuration (e.g., first size, width, spacing), and the plurality of second device level cells 220 includes a second device level cell that comprises a second configuration (e.g., second size, width, spacing) that is different than the first configuration. In some implementations, the plurality of second device level cells 220 may include other device level cells that include other configurations (e.g., third size, fourth size, fifth size) that are different than the first configuration and the second configuration. In some implementations, the second size and/or the other sizes are larger than the first size. In some implementations, the configuration of a device level cell may be defined by the number of active devices, a size, a length, a width, and/or a spacing of the device level cell. The size of a device level may be defined by a length, a width, and/or a spacing of the device level cell. Different implementations may define the configuration of a device level cell differently. The configuration of a device level cell will be further described below in at least FIGS. 4 and 6. In some implementations, the configuration of a device level cell, as used in the disclosure, may refer to the structural configuration of the device level cell and/or the physical configuration of the device level cell.

The integrated device 200 may include one or more hotspot regions. A hotspot region may include one or more hotspots. A hotspot and/or a hotspot region may be defined differently. Examples of what is a hotspot and/or a hotspot region will be further described below. In some implementations, the plurality of second device level cells 220 are located about one or more hotspots of the integrated device 200 to provide improved heat dissipation for the integrated device 200. It is noted that the plurality of first device level cells 210 may be located about a non-hotspot region and/or a hotspot region of the integrated device.

FIG. 2 illustrates two regions of the integrated device 200, a first region 204 and a second region 206. The first region 204 is a non-hotspot region, which means that there are no hotspots that have been identified in the first region 204. The first region 204 includes device level cells (e.g., 210a, 210b, 210c, 210d) that have the same configuration (e.g., same size).

The second region 206 is a hotspot region, which means that one or more hotspots have been identified in the region. In some implementations, a hotspot may originate from the device level cells and/or the active device(s) (e.g., device level transistor) of the device level cells. The second region 206 includes device level cells (e.g., 221, 223, 225, 225, 227, 229, 231, 233) that include a first configuration (e.g., first size), and device level cells (e.g., 222, 224, 226, 228) that includes one or more configurations (e.g., second size, third size) that is different than the first configurations. In some implementations, these device level cells (e.g., 222, 224, 226, 228) are part of the plurality of second device level cells 220. These device level cells (e.g., 222, 224, 226, 228) are configured to provide improved heat dissipation of one or more hotspots identified in the second region 206. These device level cells (e.g., 222, 224, 226, 228) may be modified device level cells (e.g., non-standard device level cells). In some implementations, these device level cells (e.g., 222, 224, 226, 228) may be active device level cells or dummy device level cells. As will be further described below, different implementations may use different arrangements and/or configurations of the device level cells to provide improved heat dissipation of one or more hotspots of the integrated device 200.

FIG. 3 and FIG. 4 conceptually illustrate examples of device level cells. FIG. 3 illustrates two neighboring device level cells 300. The device level cell 300 may be a device level cell from the plurality of first device level cells 210. Each of the two device level cells 300 includes a first active device 310, a second active device 320, a first oxidation diffusion (OD) layer 330, a second oxidation diffusion (OD) layer 340, a first shallow trench isolation (STI) 350, and a second shallow trench isolation (STI) 360.

The first OD layer 330 and the second OD layer 340 may represent the source and drain of the first active device 310 and the second active device 320. In some implementations, the first active device 310, the first OD layer 330 and the second OD layer 340, may represent a first device level transistor for the integrated device. In some implementations, the second active device 320, the first OD layer 330 and the second OD layer 340, may represent a second device level transistor for the integrated device. The two neighboring device level cells 300 share a shallow trench isolation (STI) (e.g., 360). The device level cell 300 has a length ($L_C$), which represents a center to center distance between two neighboring shallow trench isolations (STIs). However, the length of the device level cell 300 may be defined differently. In some implementations, the length of the device level cell 300 or any other device level cell may be defined as an edge to edge distance (e.g., inner edge to inner edge distance) between two neighboring shallow trench isolations (STIs). The active devices (e.g., 350, 360) may be spaced apart from the shallow trench isolation (STI) by a spacing S1.

FIG. 4 illustrates a device level cell 400. The device level cell 400 may be a device level cell from the plurality of second device level cells 220. The device level cell 400 includes a first active device 410, a second active device 420, the first oxidation diffusion (OD) layer 330, the second oxidation diffusion (OD) layer 340, a first shallow trench isolation (STI) 450, and a second shallow trench isolation (STI) 460.

The first OD layer 330 and the second OD layer 340 may represent the source and drain of the first active device 410 and the second active device 420. In some implementations, the first active device 410, the first OD layer 330 and the second OD layer 340, may represent a first device level transistor for the integrated device. In some implementations, the second active device 420, the first OD layer 330 and the second OD layer 340, may represent a second device level transistor for the integrated device.

The device level cell 400 is similar to the device level cell 300. However, the configuration (e.g., structural configuration, physical configuration) of the device level cell 400 is different than the device level cell 300. For example, the spacing of the active device and the shallow trench isolation (STI) in the device level cell 400 is different than that in the device level cell 300.

The device level cell 400 has a bigger size than the device level cell 300. The device level cell 400 has a length ($L_{MC}$) (e.g., second size), which is longer than the length ($L_C$) (e.g., first size) of the device level cell 300. The length of the device level cell 400 is defined as a center to center distance between two neighboring shallow trench isolations (STIs) (e.g., 450, 460). It is noted that the length of the device level cell 400 may be defined differently. In some implementations, the length of the device level cell 400 or any other device level cell may be defined as an edge to edge distance (e.g., inner edge to inner edge distance) between two neighboring shallow trench isolations (STIs). Some of the spacing of the active devices relative to the shallow trench isolation (STI) may be modified. The first active device 410 is spaced S2 away from the first shallow trench isolation (STI) 450, and the second active device 420 is spaced $S2_{MC}$ from the shallow trench isolation (STI) 460. The spacing $S2_{MC}$ is longer than the spacing S1 of the device level cell 300.

In some implementations, the additional space between the second active device 420 and the second shallow trench isolation (STI) 460 in the device level cell 400 provides better heat dissipation than the device level cell 300. In addition, there is no power leakage in the additional space, thus no additional heat is being generated in the additional space between the second active device 420 and the second shallow trench isolation (STI) 460. While the device level cell 400 takes up more space and may perform the same function as the device level cell 300, the improved heat dissipation may be worth the tradeoff. In some implementations, the device level cell 400 may be provided in regions of hotspots to reduce overheating, even if the device level cell 400 takes up more space.

In some implementations, one or more the device level cell 300 and/or the device level cell 400 may be a dummy device level cell. A dummy device level cell is a device level cell that is not electrically coupled to a circuit of the integrated device. For example, in some implementations, a dummy device level cell is not electrically coupled to other components or other device level cells (e.g., active device level cells, which is electrically coupled to a circuit of the integrated device) of a circuit of the integrated device. In some implementations, a dummy device level cell is a device level cell where no electrical current passes through the device level cell. A dummy device level cell may include one or more dummy gates or dummy components. A dummy device level cell may be located about a hotspot region of an integrated device.

In some implementations, the device level cell 300 is a standard device level cell. In some implementations, a standard device level cell for an integrated device is a device level cell that comprises a configuration that represents a majority (e.g., about 90 percent or more, but less than 100 percent; about 99 percent of more, but less than 100 percent; about 99.99 percent or more, but less than 100 percent; about 99.999 percent or more, but less than 100 percent) of the device level cells of an integrated device. In some implementations, standard device level cells represent between about 90 percent and 99.999 percent of all device level cells of an integrated device. The above percentages may represent the total number of standard device level cells with respect to the total number of device level cells. The above percentages may represent the total area of all the standard device level cells with respect to the total area of all the device level cells.

In some implementations, modified device level cells may represent about 0.001 percent or less (but greater than zero) of all device level cells of an integrated device. In some implementations, modified device level cells may represent about 1 percent or less (but greater than zero) of all device level cells of an integrated device. In some implementations, modified device level cells may represent about 10 percent or less (but greater than zero) of all device level cells of an integrated device. The above percentages may represent the total number of modified device level cells with respect to the total number of device level cells. The above percentages may represent the total area of all the modified device level cells with respect to the total area of all the device level cells.

A standard device level cell and/or a modified device level cell may be active device level cells that are electrically coupled to one or more circuits of the integrated device.

It is noted that different implementations may specify a standard device level cell to have different arrangements and/or configurations. The standard device level cells illustrated in the present disclosure include two active devices. However, other implementations may include different numbers of active devices. For example, a standard device level cell may only include one active device or it can have more than two active devices (e.g., three active devices, four active devices).

In some implementations, initially, all the device level cells of an integrated device are designed to have the same configuration and/or same size, and potential hotspots in the integrated device are identified, and then some device level cells about the identified hotspots are modified (e.g., configuration of device level cells is changed, size of device level cells are changed, spacing of active devices are changed, spacing of STIs are changed) to provide improved heat dissipation for the integrated device. In some implementations, the modification of the device level cells is performed during a floor planning process of an integrated device design. An example of such a process is described further below in FIGS. 25A-25B and 27.

Figure 5:
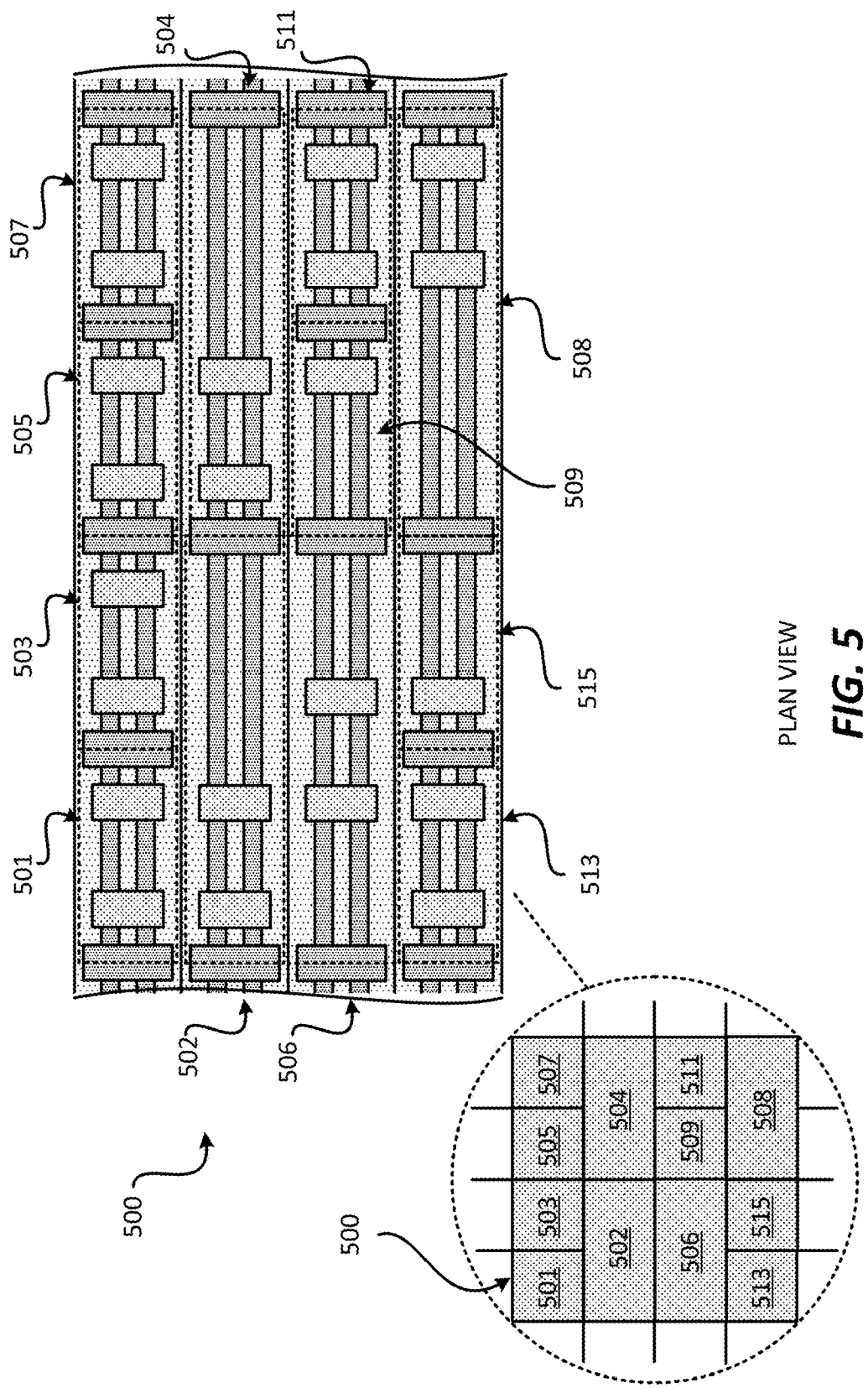
FIG. 5 illustrates a plan view of neighboring device level cells around a hotspot of an integrated device.

FIG. 5 illustrates a region 500 of the integrated device 200. The region 500 is a hotspot region that includes at least one hotspot. The region 500 includes a plurality of first device level cells (e.g., 501, 503, 505, 507, 509, 511, 513, 515). The region 500 also includes a plurality of second device level cells (e.g., 502, 504, 506, 508). As shown in FIG. 5, the plurality of second device level cells (e.g., 502, 504, 506, 508) have different configurations (e.g., size) than the plurality of first device level cells (e.g., 501, 503, 505, 507, 509, 511, 513, 515). The plurality of first device level cells (e.g., 501, 503, 505, 507, 509, 511, 513, 515) may be similar to the device level cell 300. The plurality of second device level cells (e.g., 502, 504, 506, 508) may be similar to the device level cell 400. In some implementations, the plurality of first device level cells (e.g., 501, 503, 505, 507, 509, 511, 513) may represent standard device level cells, which represent a majority of the device level cells of an integrated device.

It is noted that the region 500 is merely an example of how a region that includes at least one hotspot may be configured. Different implementations may arrange the device level cells differently and/or may use device level cells with different configurations in a region that includes at least one hotspot.

As mentioned above, different implementations may define a hotspot and/or a hotspot region differently. In some implementations, a hotspot may be defined as a region and/or component (e.g., transistor, device level cell) of the integrated device that has a temperature of about at least about 95 degrees Celsius (C) when the integrated device is operating. In some implementations, a hotspot may be defined as a region of the integrated device that has a temperature that is at least about in the 95$^{th}$ percentile of temperatures for the plurality of regions. For example, if the integrated device is divided into 100 substantially uniform regions across the device level layer, the top 5 regions with the highest associated temperatures would be identified as hotspot regions. The rest of the 95 regions would be non-hotspot regions that would include standard device level cells. It is noted that the top 5 regions may include modified device level cells and in some implementations, combinations of modified device level cells and standard device level cells. The term modified device level cell shall mean a device level cell that is different than a standard device level cell. In some implementations, a standard device level cell shall mean a device level cell that is at least a majority of all the device level cells of the integrated device.

FIGS. 6-8 illustrate a FinFET 600 that may be implemented in a device level cell (e.g., 300, 400). The FinFET 600 may be a planar FinFET. In some implementations, the FinFET 600 may be configured as a device level transistor. The FinFET 600 includes a gate 610, a source 620, a drain 630, a dielectric 640, an oxide layer 650 and a substrate 660. The dielectric 640 may comprise a high k dielectric.

In some implementations, the FinFET 600 may implemented as the first active device 310, the second active device 320, the first active device 410, the second active device 420, and/or any other active devices described in the disclosure.

FIGS. 9-11 illustrate a FinFET 900 that may be implemented in a device level cell (e.g., 300, 400). The FinFET 900 may be a 3D FinFET. In some implementations, the FinFET 900 may be configured as a device level transistor. The FinFET 900 includes a gate 910, a source 920, a drain 930, a dielectric 940, an oxide layer 950 and a substrate 960. The dielectric 940 may comprise a high k dielectric.

In some implementations, the FinFET 900 may be implemented as the first active device 310, the second active device 320, the first active device 410, the second active device 420, and/or any other active devices described in the disclosure.

FIG. 12 illustrate an active device 1200 that may be implemented in a device level cell (e.g., 300, 400). The active device 1200 may be configured as a device level transistor. The active device 1200 includes a gate 1210, a source 1220, a drain 1230 and a substrate 1260. In some implementations, the active device 1200 may be implemented as the first active device 310, the second active device 320, the first active device 410, the second active device 420, and/or any other active devices described in the disclosure.

Figure 13:
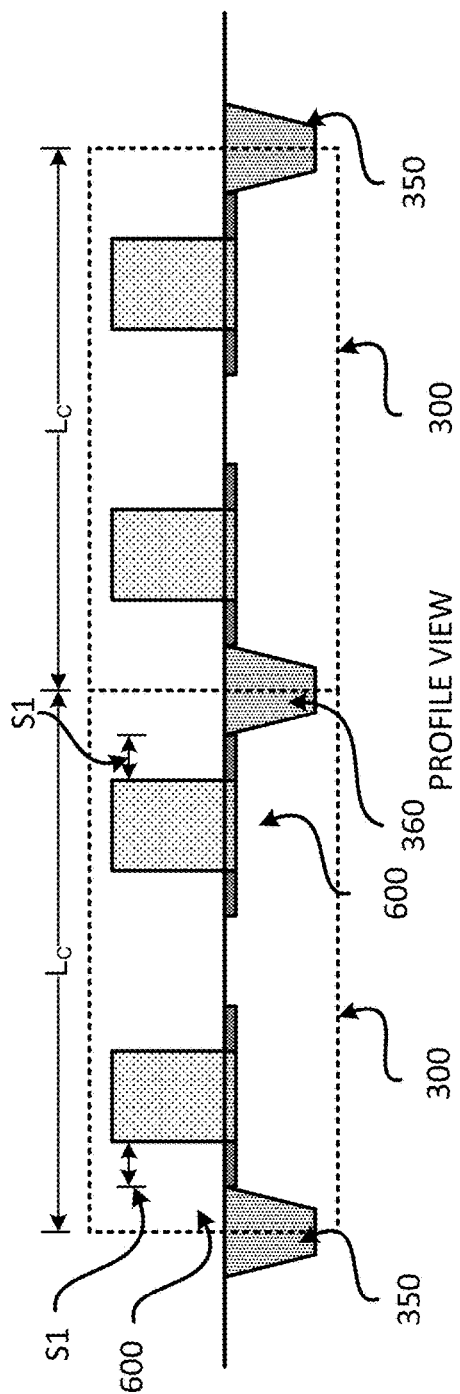
FIG. 13 illustrates a profile view of two neighboring device level cells for an integrated device, where the device level cells include planar FinFETs.
Figure 14:
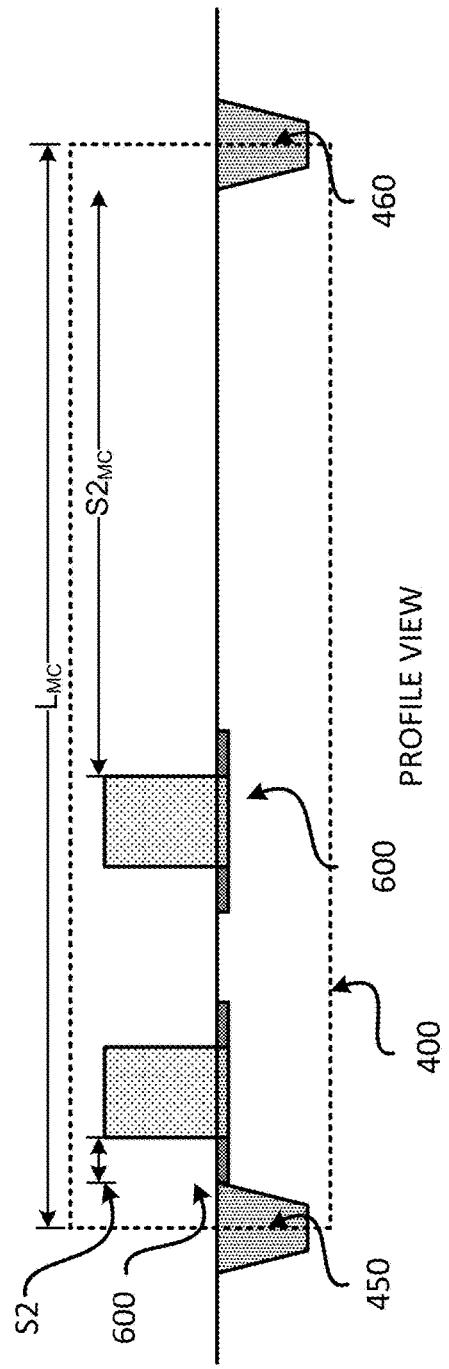
FIG. 14 illustrates a profile view of a modified device level cell for an integrated device, where the device level cell includes planar FinFETs.

FIG. 13 and FIG. 14 illustrate examples of device level cells that include FinFETs. FIG. 13 illustrates two neighboring device level cells 300 that include the FinFETs 600. Two FinFETs 600 are located between the first shallow trench isolation (STI) 350 and the second shallow trench isolation (STI) 360.

FIG. 14 illustrates the device level cell 400 that includes the FinFETs 600 located between the first shallow trench isolation (STI) 450 and the second shallow trench isolation (STI) 460. The spacing between the FinFETs 600, the first shallow trench isolation (STI) 350 and the second shallow trench isolation (STI) 360 in the device level cell 400 is different than the spacing in the device level cell 300, which is described in FIGS. 3 and 4.

Figure 15:
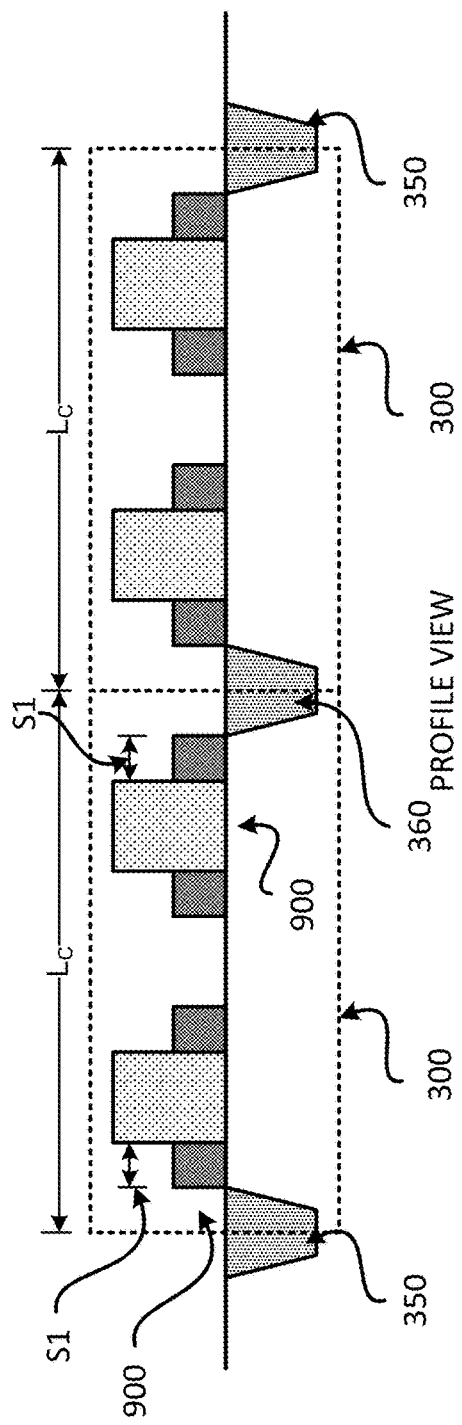
FIG. 15 illustrates a profile view of two neighboring device level cells for an integrated device, where the device level cells include FinFETs.
Figure 16:
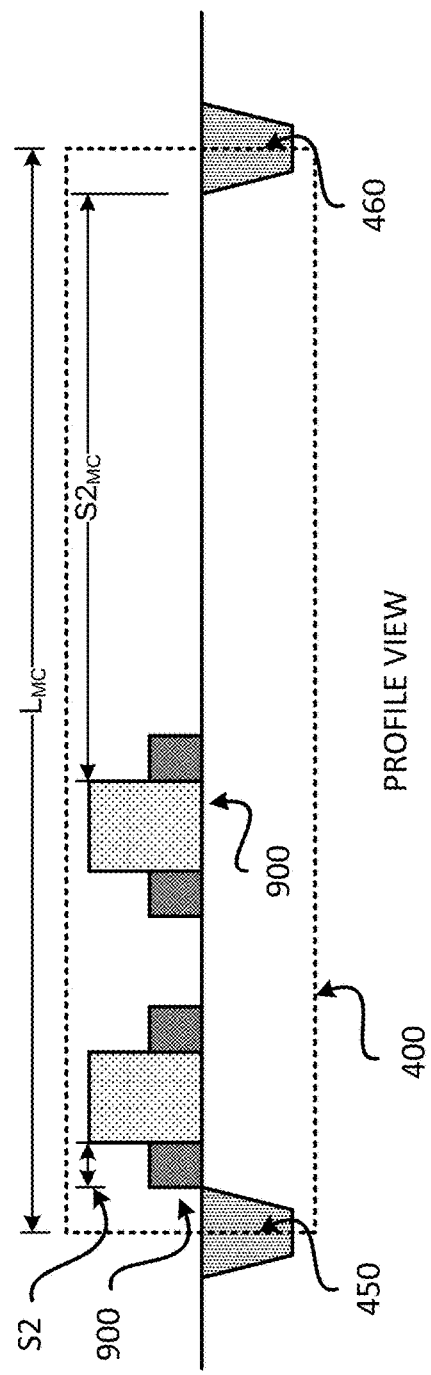
FIG. 16 illustrates a profile view of a modified device level cell for an integrated device, where the device level cell includes FinFETs.

FIG. 15 and FIG. 16 illustrate examples of device level cells that include FinFETs. FIG. 15 illustrates two neighboring device level cells 300 that include the FinFETs 900. Two FinFETs 900 are located between the first shallow trench isolation (STI) 350 and the second shallow trench isolation (STI) 360.

FIG. 16 illustrates the device level cell 400 that includes the FinFETs 900 located between the first shallow trench isolation (STI) 450 and the second shallow trench isolation (STI) 460. The spacing between the FinFETs 900, the first shallow trench isolation (STI) 350 and the second shallow trench isolation (STI) 360 in the device level cell 400 is different than the spacing in the device level cell 300, which is described in FIGS. 3 and 4.

FIG. 17 and FIG. 18 illustrate examples of device level cells that include FinFETs. FIG. 17 illustrates two neighboring device level cells 300 that include the active devices 1200. Two active devices 1200 are located between the first shallow trench isolation (STI) 350 and the second shallow trench isolation (STI) 360.

FIG. 18 illustrates the device level cell 400 that includes the active devices 1200 located between the first shallow trench isolation (STI) 450 and the second shallow trench isolation (STI) 460. The spacing between the active devices 1200, the first shallow trench isolation (STI) 350 and the second shallow trench isolation (STI) 360 in the device level cell 400 is different than the spacing in the device level cell 300, which is described in FIGS. 3 and 4.

Having described different implementations of device level cells with different configurations, sizes, and arrangements, a detailed example of an integrated device that includes device level cells will now be described below.

Figure 19:
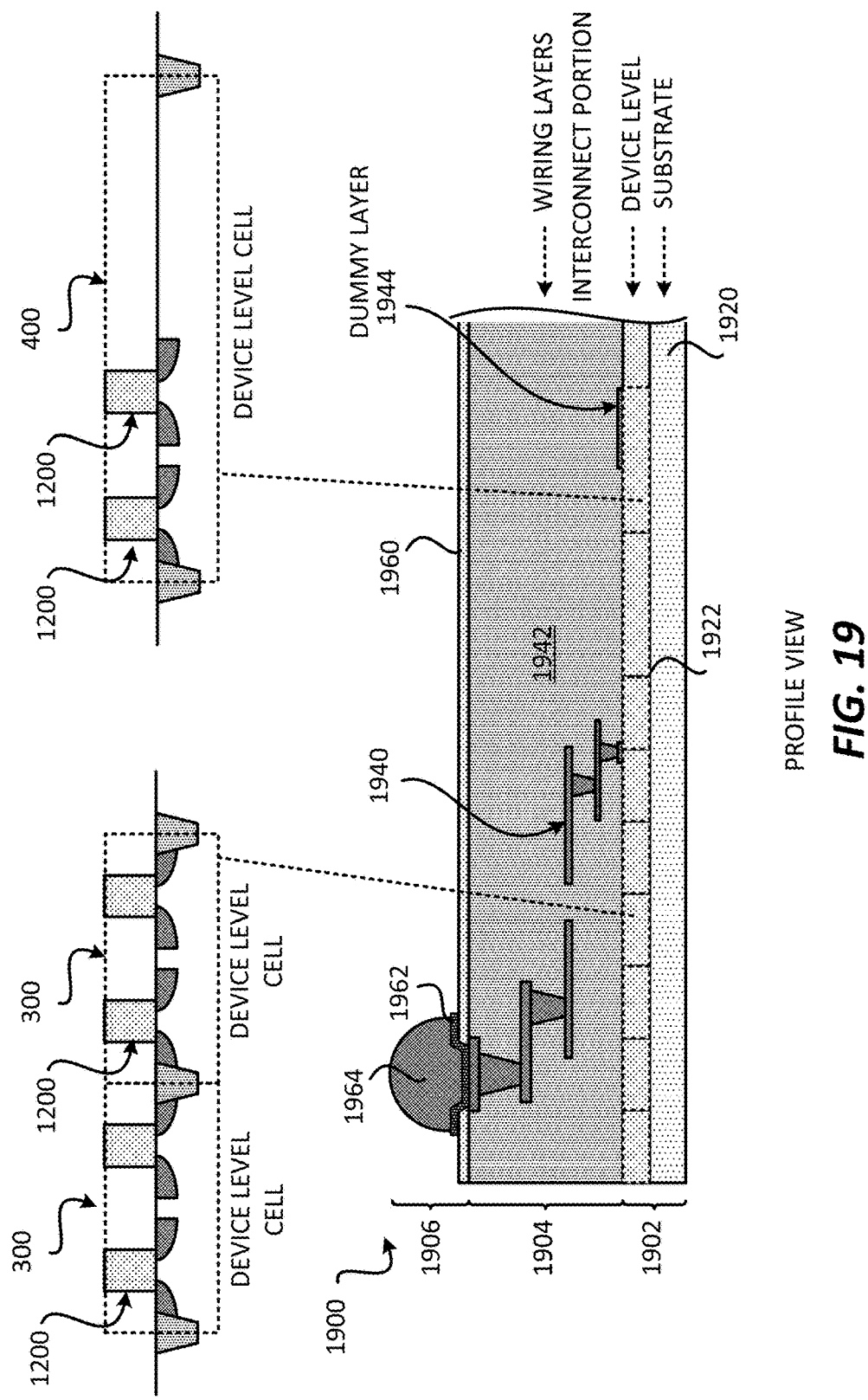
FIG. 19 illustrates a profile view of an integrated device that includes device level cells with different sizes.

FIG. 19 illustrates a profile view of an integrated device 1900 that includes device level cells with different configurations (e.g., sizes). In some implementations, the integrated device 1900 may be a memory device. In some implementations, the integrated device 1900 may be similar to the integrated device 200.

The integrated device 1900 includes a substrate 1920, a plurality of device level cells 1922, interconnect portion 1904, and a packaging portion 1906. The plurality of device level cells 1922 is formed over the substrate 1920. The plurality of device level cells 1922 may be form the device level layer of the integrated device 1900. In some implementations, the plurality of device level cells 1922 may include portions of the substrate 1920. The plurality of device level cells 1922 may form the device level layer of the integrated device 1900. In some implementations, the substrate 1920, the device level layer and the plurality of device level cells 1922 may be referred as the substrate portion 1902 of the integrated device 1900.

The plurality of device level cells 1922 includes the device level cell 300 and the device level cell 400. FIG. 19 illustrates that the device level cell 300 and the device level cell 400 include the active devices 1200. However, the device level cell 300 and the device level cell 400 may include other components such as the FinFETs 600 and/or the FinFETs 900.

The interconnect portion 1904 is formed over the substrate portion 1902. In particular, the interconnect portion 1904 is formed over the plurality of device level cells 1922. The interconnect portion 1904 includes wiring layers. The interconnect portion 1904 includes a plurality of interconnects 1940 (e.g., trace, pad, vias) and at least one dielectric layer 1942.

In some implementations, the interconnect portion 1904 may also include at least one dummy metal layer 1944. The dummy metal layer 1944 may be positioned over a device level cell that is identified to be in a hotspot region. For example, the dummy metal layer 1944 may be formed over the device level cell 400. The dummy metal layer 1944 is configured to help heat dissipation over the hotspot of an integrated device. The dummy metal layer 1944 does not provide an electrical path for signal or power since it is not electrically coupled to a circuit. The dummy metal layer 1944 may include one or more dummy metal layers. The dummy metal layer 1944 may be coupled to other dummy metal layers and/or dummy components. For example, the dummy metal layer 1944 may be coupled to one or more dummy vias, one or more dummy traces, and/or one or more dummy pads. None of the dummy vias, dummy traces, and/or dummy pads are electrically coupled to a circuit. None of the dummy vias, dummy traces, and/or dummy pads provide an electrical path for signal or power.

A packaging portion 1906 is formed over the interconnect portion 1904. The packaging portion 1906 includes a passivation layer 1960, an under bump metallization (UBM) layer 1962 and a solder interconnect 1964.

Figure 20:
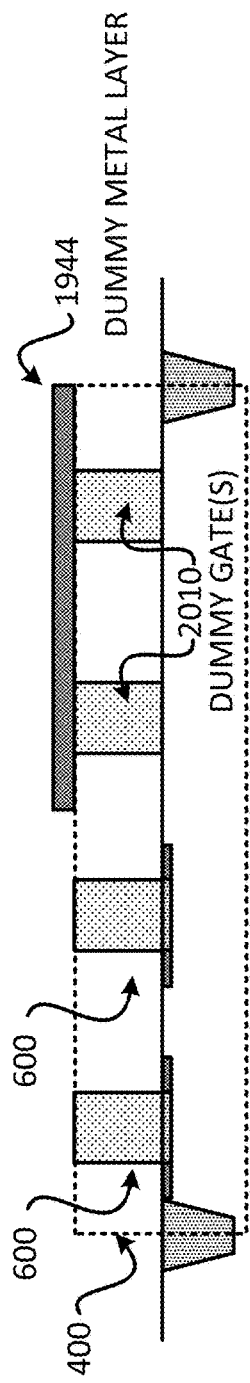
FIG. 20 illustrates a profile view of a dummy metal layer over a device level cell that includes a dummy gate.
Figure 21:
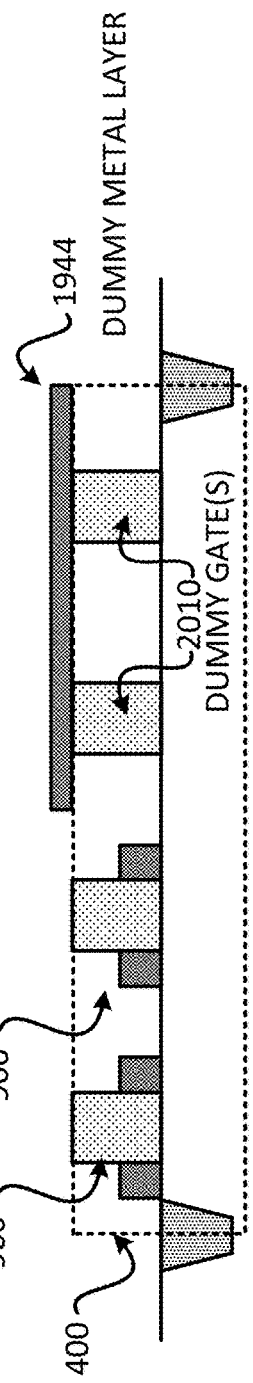
FIG. 21 illustrates a profile view of a dummy metal layer over a device level cell that includes a dummy gate.
Figure 22:
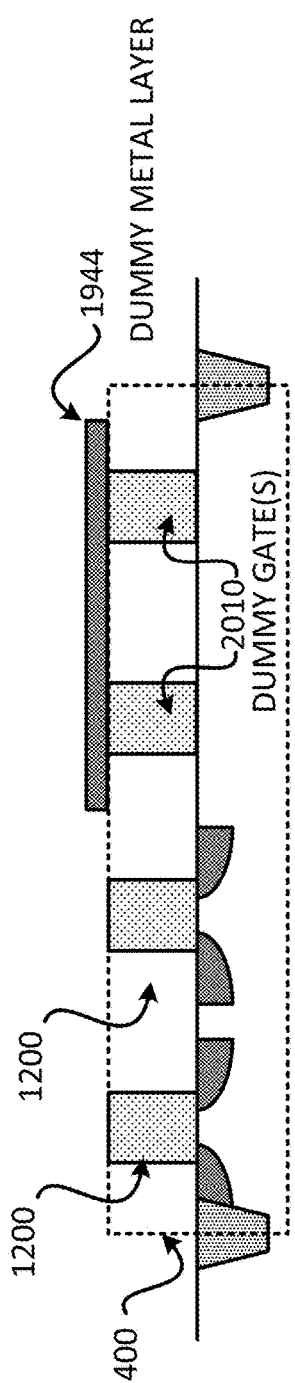
FIG. 22 illustrates a profile view of a dummy metal layer over a device level cell that includes a dummy gate.

FIGS. 20-22 illustrate device level cells that include at least one dummy gate (e.g., 2010) and how a dummy metal layer (e.g., 1944) may be formed over a device level cell. FIG. 20 illustrates the device level cell 400 that includes the FInFETs 600 and two dummy gates 2010. A dummy metal layer 1944 is formed over the device level cell 400 that includes the FinFET 600. Specifically, the dummy metal layer 1944 is formed over and coupled to the two dummy gates 2010. In some implementations, the device level cell 400 may include no dummy gates, just one dummy gate 2010, or more than two dummy gates 2010. In some implementations, the device level cell 400 includes at least one dummy gate 2010, but there is no dummy metal layer 1944 over the dummy gate 2010. In some implementations, one or more dummy metal layer (e.g., 1944) may be formed over one or both of the FinFETs 600.

FIG. 21 illustrates the device level cell 400 that includes the FInFETs 900 and two dummy gates 2010. A dummy metal layer 1944 is formed over the device level cell 400 that includes the FinFET 900. Specifically, the dummy metal layer 1944 is formed over and coupled to the two dummy gates 2010. In some implementations, the device level cell 400 may include no dummy gates, just one dummy gate 2010, or more than two dummy gates 2010. In some implementations, the device level cell 400 includes at least one dummy gate 2010, but there is no dummy metal layer 1944 over the dummy gate 2010. In some implementations, one or more dummy metal layer (e.g., 1944) may be formed over one or both of the FinFETs 900.

FIG. 22 illustrates the device level cell 400 that includes the active devices 1200 and two dummy gates 2010. A dummy metal layer 1944 is formed over the device level cell 400 that includes the active devices 1200. Specifically, the dummy metal layer 1944 is formed over and coupled to the two dummy gates 2010. In some implementations, the device level cell 400 may include no dummy gates, just one dummy gate 2010, or more than two dummy gates 2010. In some implementations, the device level cell 400 includes at least one dummy gate 2010, but there is no dummy metal layer 1944 over the dummy gate 2010. In some implementations, one or more dummy metal layer (e.g., 1944) may be formed over one or both of the active devices 1200.

Having described different implementations of an integrated device that includes device level cells with different configurations, sizes, and arrangements, a sequence for fabricating an integrated device that includes device level cells will now be described below.

Figure 23A:
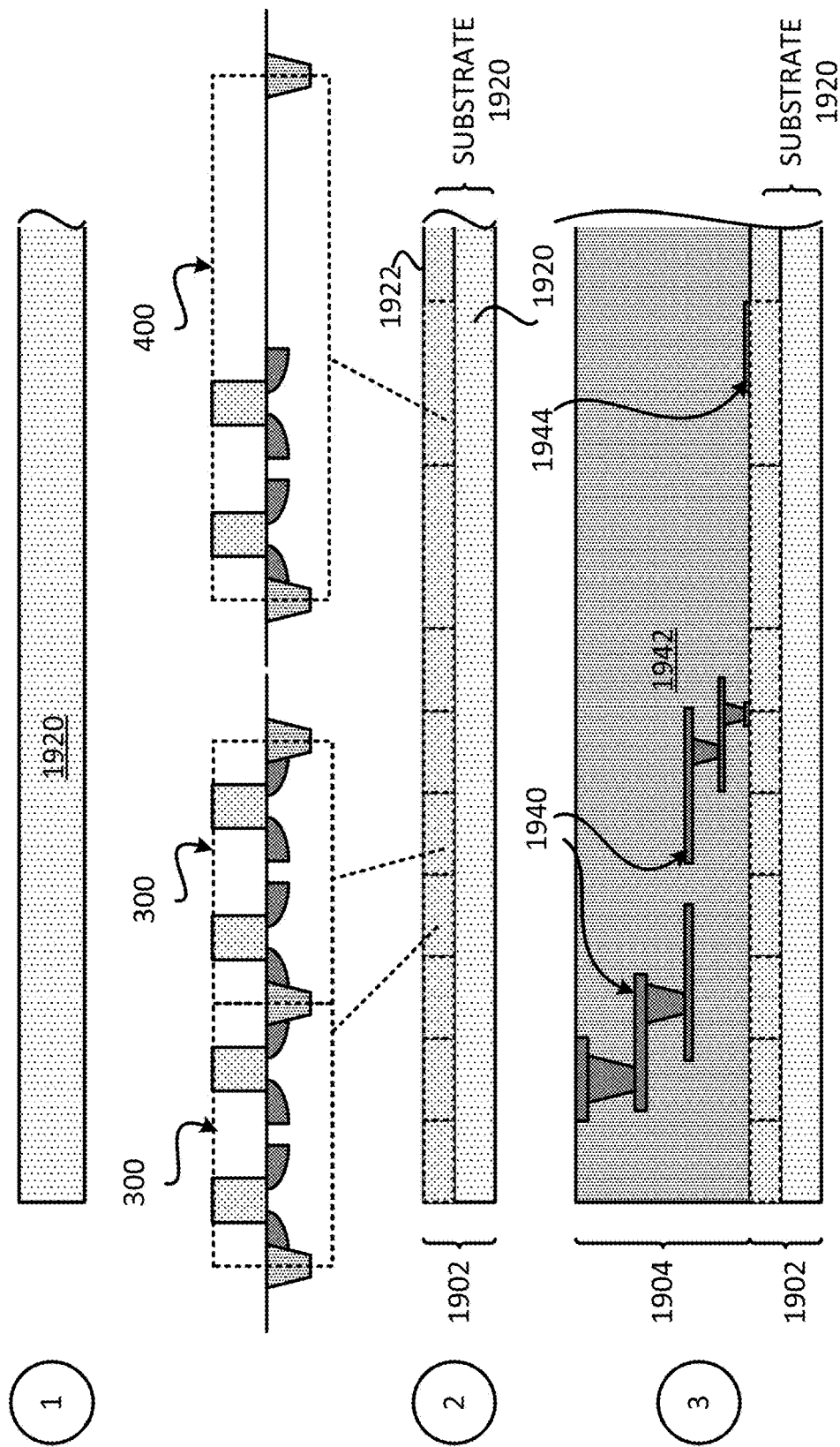
FIG. 23 (comprising FIGS. 23A-23B) illustrates an exemplary sequence for fabricating an integrated device that includes device level cells with different sizes.
Figure 23B:
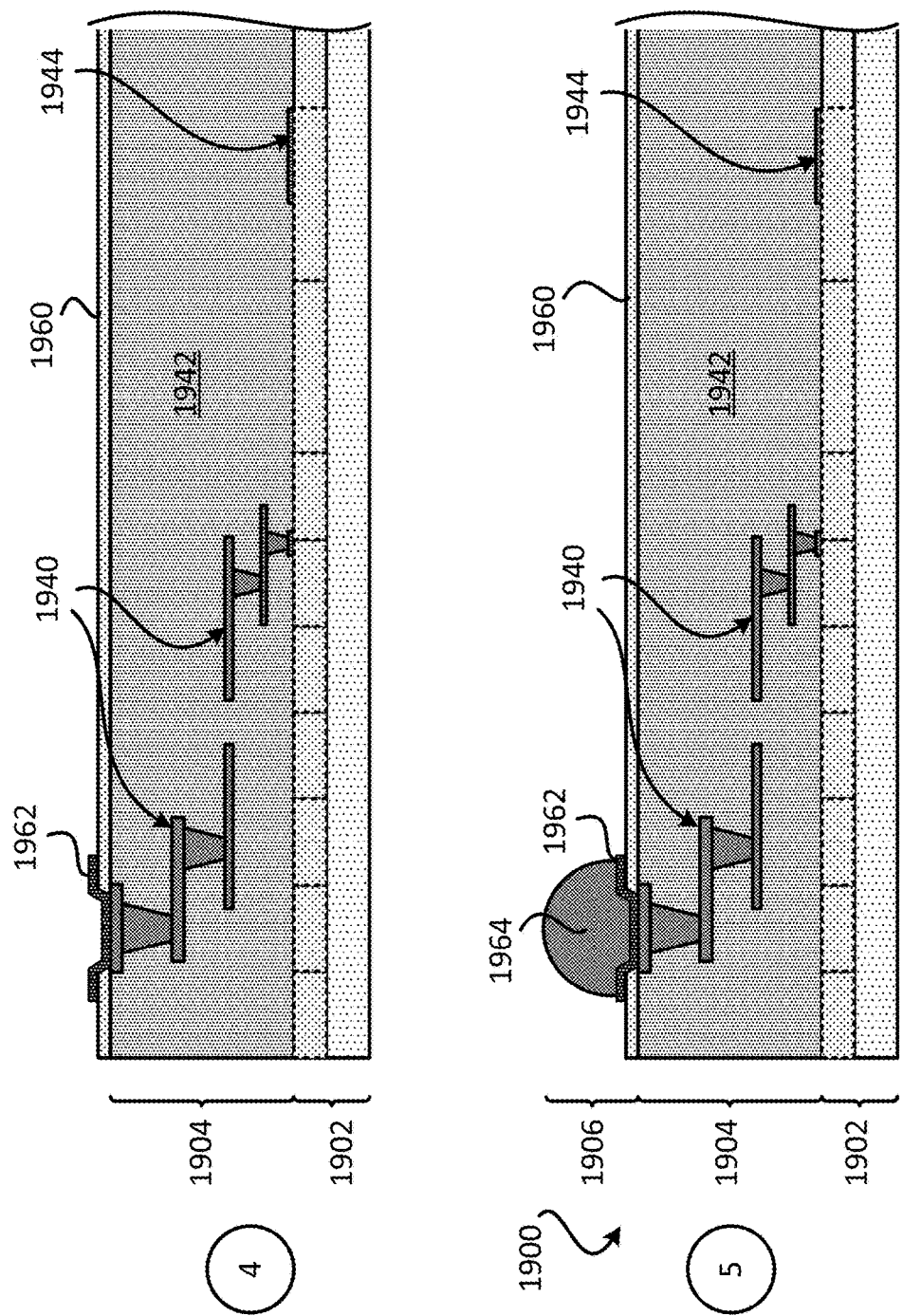

Exemplary Sequence for Fabricating an Integrated Device Comprising Device Level Cells with Variable Sizes Around Hotspots of the Integrated Device In some implementations, fabricating an integrated device that includes device level cells with different configurations (e.g., sizes) around hotspots includes several processes. FIG. 23 (which includes FIGS. 23A-23B) illustrates an exemplary sequence for providing or fabricating an integrated device that includes device level cells with different configurations (e.g., sizes) around hotspots. In some implementations, the sequence of FIGS. 23A-23B may be used to provide or fabricate the integrated device of FIG. 19 and/or other integrated devices described in the present disclosure.

It should be noted that the sequence of FIGS. 23A-23B may combine one or more stages in order to simplify and/or clarify the sequence for providing or fabricating an integrated device that includes device level cells with different configurations (e.g., sizes) around hotspots. In some implementations, the order of the processes may be changed or modified. In some implementations, one or more of processes may be replaced or substituted without departing from the spirit of the disclosure.

Stage 1, as shown in FIG. 23A, illustrates a state after a substrate 1920 is provided. Different implementations may provide different materials for the substrate 1920. In some implementations, the substrate 1920 may include silicon.

Stage 2 illustrates a state after the device level layer is formed over the substrate 1920. The device level layer includes the plurality of device level cells 1922 (e.g., 300, 400). Thus, Stage 2 illustrates a state after the plurality of device level cells 1922 is formed over the substrate 1920. In some implementations, a front end of line (FEOL) process may be used to fabricate the device level layer (e.g., plurality of device level cells 1922). The plurality of device level cells may include device level cells with different configurations (e.g., sizes), shapes, arrangement, as described above. The device level cells may include one or more active devices (e.g., 1200). The device level cells may include a FinFET (e.g., 600, 900).

Stage 3 illustrates a state after the interconnect portion 1904 is formed. The interconnect portion 1904 may include plurality of interconnects 1940 and at least one dielectric layer 1942. The interconnect portion 1904 may also include at least one dummy metal layer 1944 over a device level cell that is around a hotspot. In some implementations, a back end of line (BEOL) process may be used to fabricate interconnect portion 1904.

Stage 4, as shown in FIG. 23B, illustrates a state after a passivation layer 1960 and the under bump metallization (UBM) layer 1962 are formed over the interconnect portion 1904.

Stage 5 illustrates a state after a solder interconnect is coupled to the under bump metallization (UBM) layer 1962.

Figure 24:
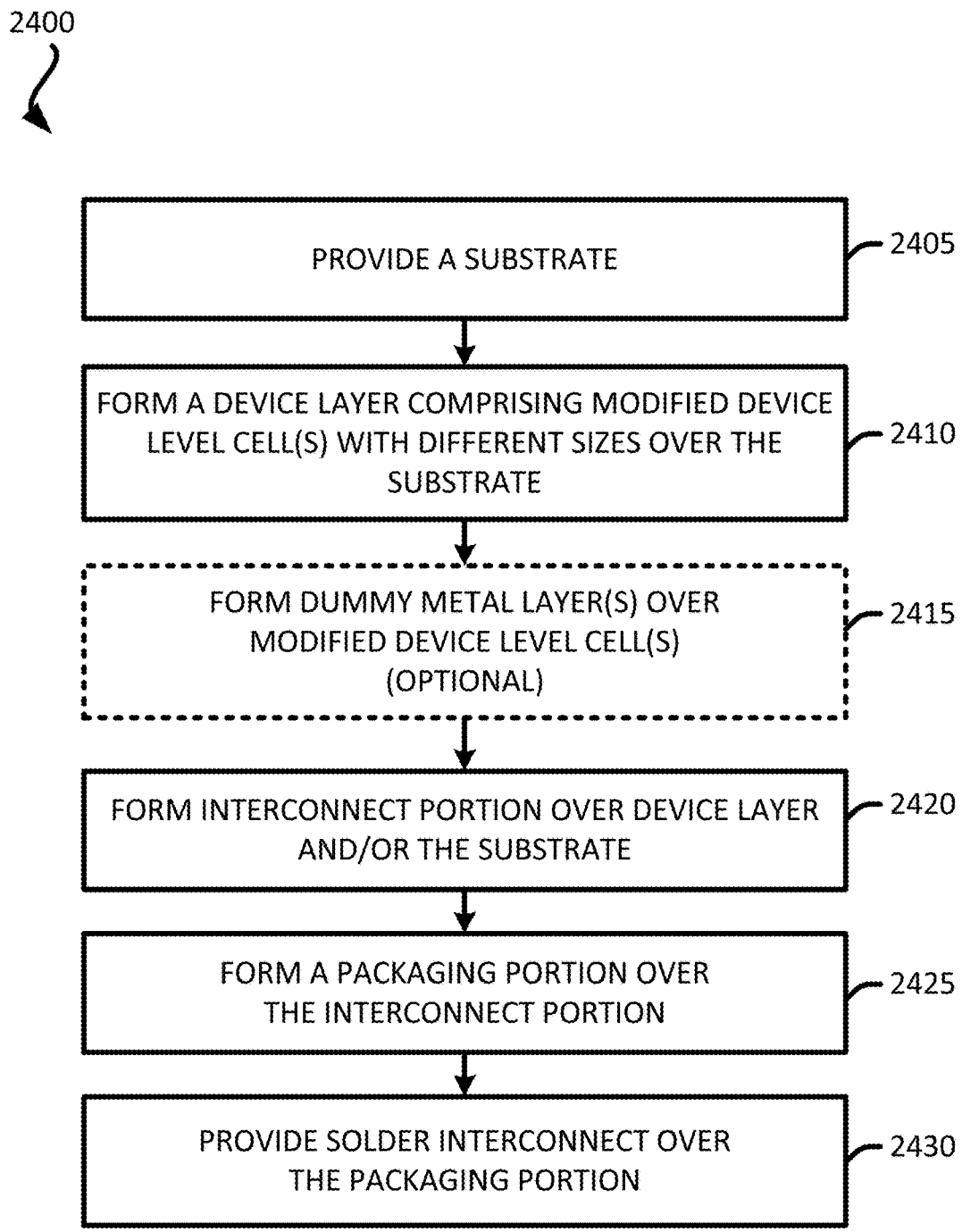
FIG. 24 illustrates an exemplary flow diagram of a method for fabricating an integrated device that includes device level cells with different sizes.

Exemplary Flow Diagram of a Method for Fabricating an Integrated Device Comprising Device Level Cells with Different Sizes Around Hotspots of the Integrated Device In some implementations, providing an integrated device that includes device level cells with different configurations (e.g., sizes) around hotspots includes several processes. FIG. 24 illustrates an exemplary flow diagram of a method 2400 for providing or fabricating an integrated device that includes device level cells with different configurations (e.g., sizes) around hotspots. In some implementations, the method 2400 of FIG. 24 may be used to provide or fabricate the integrated device of FIG. 19 and/or other integrated devices described in the present disclosure.

It should be noted that the sequence of FIG. 24 may combine one or more processes in order to simplify and/or clarify the method for providing or fabricating an integrated device that includes device level cells with different configurations (e.g., sizes) around hotspots. In some implementations, the order of the processes may be changed or modified.

The method provides (at 2405) a substrate (e.g., 1920). Different implementations may provide different materials for the substrate. In some implementations, the substrate may include silicon.

The method forms (at 2410) a device level layer (e.g., the plurality of device level cells 1922) over the substrate. In some implementations, a front end of line (FEOL) process may be used to fabricate the device level layer (e.g., plurality of device level cells 1922). The device level layer may include a plurality of device level cells (e.g., 300, 400). The plurality of device level cells may include device level cells with different configurations (e.g., sizes), shapes, arrangement, as described above. The device level cells may include one or more active devices (e.g., 1200). The device level cells may include a FinFET (e.g., 600, 900). In some implementations, a device level cell may be dummy device level cell.

The method optionally forms (at 2415) at least one dummy metal layer 1944 over at least one device level cell that is around or about a hotspot.

The method forms (at 2420) an interconnect portion 1904 over the device level layer (e.g., plurality of device level cells 1922) and/or the substrate 1920. The interconnect portion 1904 may include a plurality of interconnect 1940 and at least one dielectric layer 1942. It is noted that the interconnect portion 1904 may also include at least one dummy metal layer 1944 over a device level cell that is around a hotspot. In some implementations, a back end of line (BEOL) process may be used to form the interconnect portion 1904.

The method forms (at 2425) a packaging portion 1906 over the interconnect portion 1904. The packaging portion 1906 may include the passivation layer 1960 and the under bump metallization (UBM) layer 1962. The passivation layer 1960 and the under bump metallization (UBM) layer 1962 are formed over the interconnect portion 1904.

The method provides (at 2430) a solder interconnect 1964. In some implementations, the solder interconnect 1964 is coupled to the under bump metallization (UBM) layer 1962.

It is also noted that the method 2400 of FIG. 24 may be used to fabricate (e.g., concurrently fabricate) several integrated devices on a wafer. The wafer is then singulated (e.g., cut) into individual integrated devices. These singulated integrated devices may then be coupled to dies and/or printed circuit boards (PCBs).

Figure 25A:
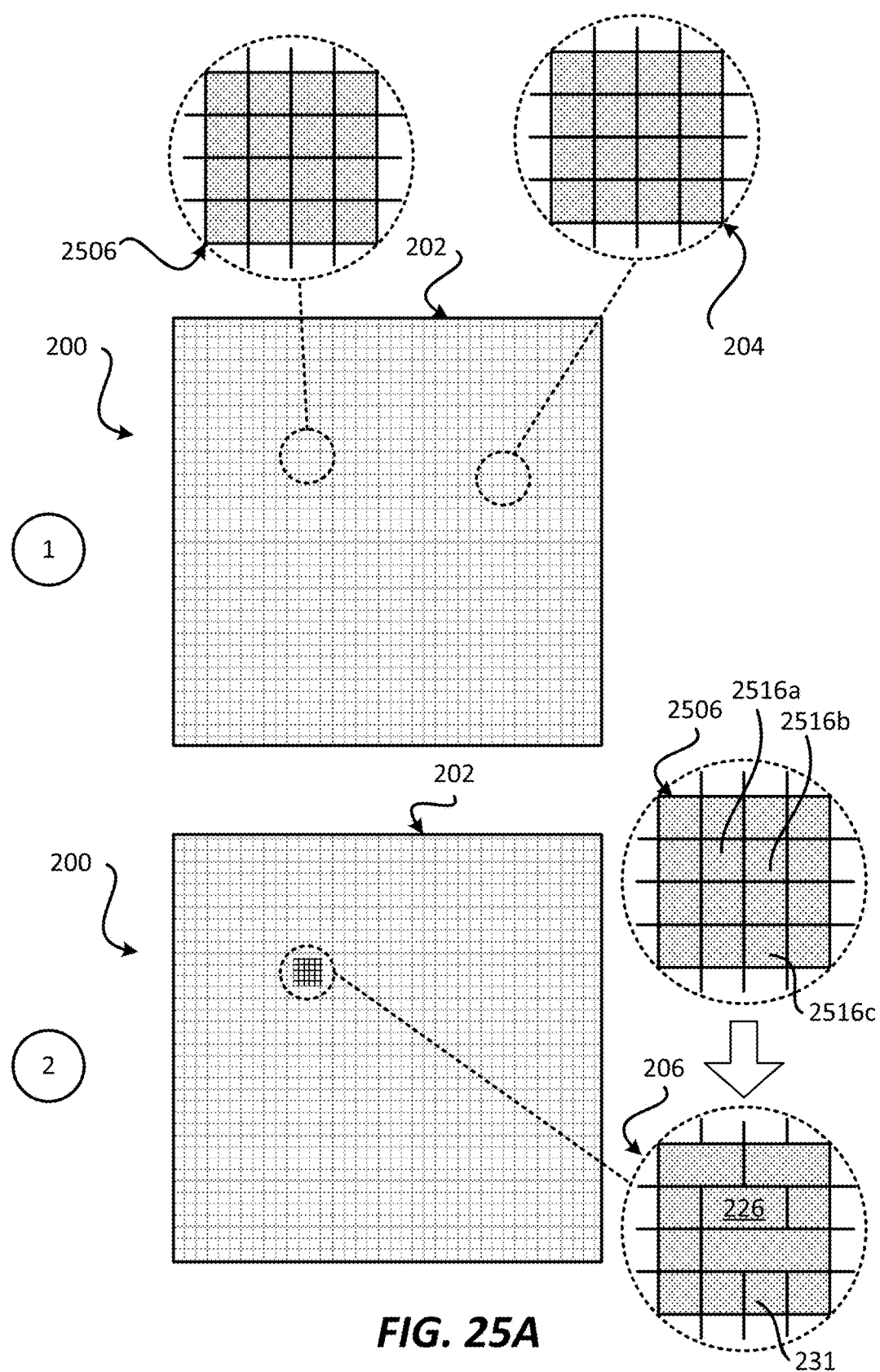
FIG. 25 (comprising FIGS. 25A-25B) illustrates an exemplary sequence for modifying the size of one or more device level cells of an integrated device.
Figure 25B:
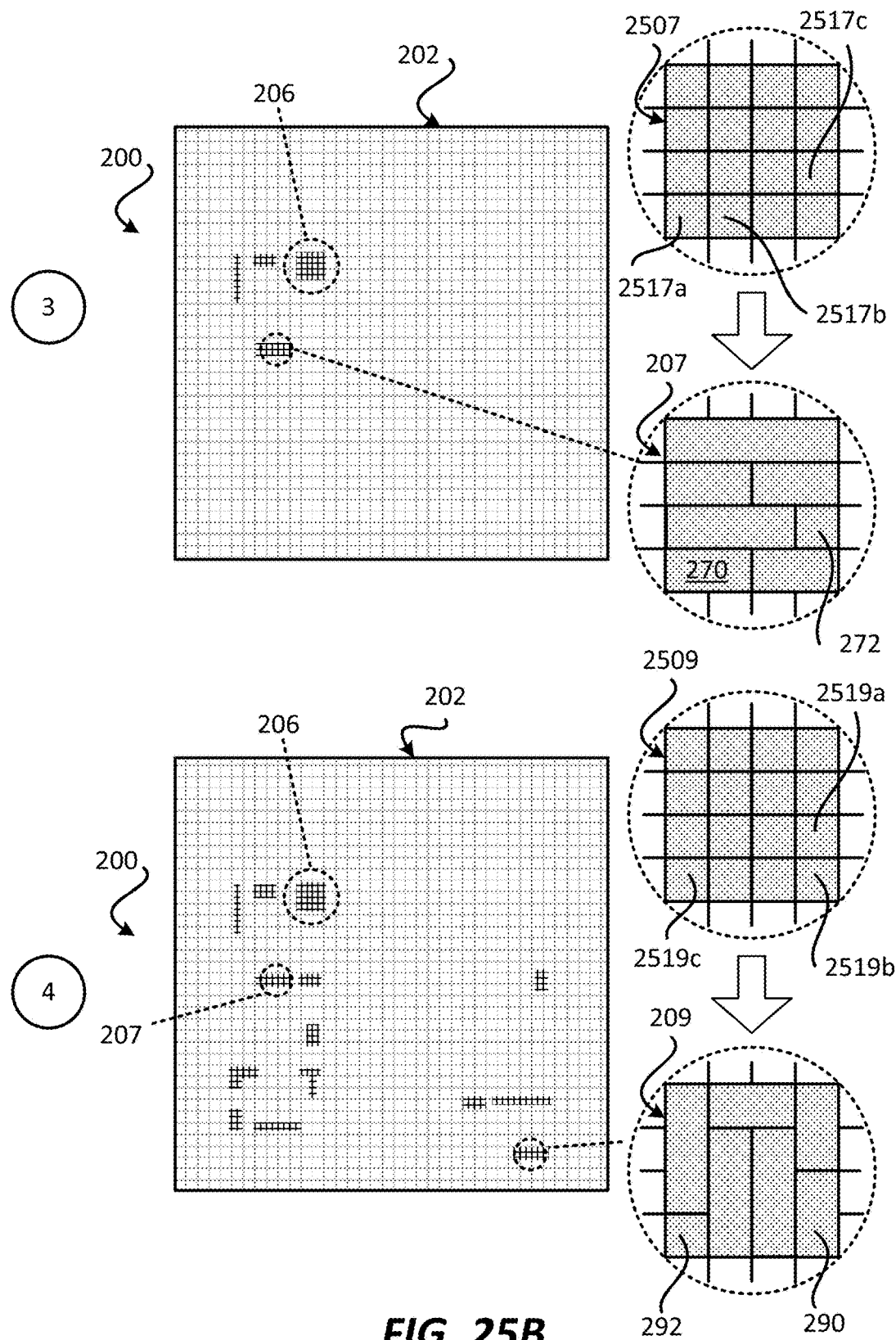

Exemplary Sequence for Designing and Modifying the Size of Device Level Cells Around Hotspots of an Integrated Device In some implementations, designing and modifying the location and/or configuration (e.g., size) of device level cells over hotspots includes several processes. FIG. 25 (which includes FIGS. 25A-25B) illustrates an exemplary sequence for designing and modifying the location and/or configuration (e.g., size) of device level cells over hotspots. In some implementations, the sequence of FIGS. 25A-25B may be used to provide or design the integrated device of FIG. 19 and/or other integrated devices described in the present disclosure.

It should be noted that the sequence of FIGS. 25A-25B may combine one or more stages in order to simplify and/or clarify the sequence for designing and modifying the location and/or configuration (e.g., size) of device level cells over hotspots. In some implementations, the order of the processes may be changed or modified. In some implementations, one or more of processes may be replaced or substituted without departing from the spirit of the disclosure.

In some implementations, the sequence shown in FIG. 25 may be performed during a floor planning process of designing an integrated device.

Stage 1, as shown in FIG. 25A, illustrates a layout of the device level layer of the integrated device 200 that has been uniformly divided into a plurality of device level cells 202. A device level cell may be part of a cell for an integrated device. A cell of an integrated device may include the device level cell and interconnects positioned over the device level cell, such as interconnects in the interconnect portion (e.g., 1904) of the integrated device. The device level layer includes a region 204 and a region 2506. Each region includes a plurality of device level cells that are each uniformly the same (e.g., have the same structural and/or physical configuration). Thus, Stage 1 illustrates a layout that includes standard level cells that are all the same. These standard device level cells may each include one active device, two active devices, three active devices, four active devices, or more than four active devices. Examples of active devices for a device level cell are described in at least FIGS. 6-12.

Stage 2 illustrates a state after at least one potential hot spot has been identified around the region 2506, and device level cells of the region 2506 have been modified to include device level cells that have different configurations (e.g., sizes) and/or arrangements. In some implementations, modifying a device level cell may include moving the device level cell, removing the device level cell, replacing the device level cell. A potential hot spot that is identified around a region (e.g., 2506, 2507. 2509) may be located near the region, in the region, over the region, and/or around the region. A region around the potential hot spot may include the potential hotspot or hotpot region. As shown in Stage 2, the region 2506 has been changed to a region 206 that includes device level cells with configurations (e.g., sizes) and/or arrangements. As a result, some of the device level cells in the region 206 are no longer standard device level cells. It is noted that not all standard device level cells of the region 206 are modified or have to be modified.

Stage 2 illustrates that the region 2506 includes a device level cell 2516a, a device level cell 2516b, and a device level cell 2516c. Stage 2 further illustrates that the device level cell 2516a has been modified to a device level cell 226, and the device level cell 2516b has been removed. The device level cell 2516c remains the same, but is now labeled as device level cell 231. As a result, the region 206 includes the device level cell 226 and the device level cell 231. Examples of how device level cells may be modified are also illustrated and described in at least FIG. 5.

Various models and assumptions may be made to determine which device level cells are modified and how device level cells are modified. As an example, an active device level cell (e.g., standard device level cell) may be assumed to generate about 0.64 mW of power and have a coefficient of thermal conductivity of about 0.2 W/m-K, while the modified device level cell may be assumed to generate no power, and have a coefficient of thermal conductivity of about 400 W/m-K. It is noted that different models and/or assumptions may result in different device level cells being modified, replaced, removed and/or moved. In some implementations, device level cells that are within about 20 micrometers (μm) of a hotspot (e.g., potential hotspot) and/or hotspot region (e.g., potential hotspot region) are modified. In some implementations, device level cells that are within about 4 rows and/or 4 columns (e.g., within about 4 device level cells) of a hotspot and/or hotspot region (e.g., region that include a device level cell that has been identified as a potential hotspot) are modified.

Stage 3, as shown in FIG. 25B, illustrates a state after at least one potential hot spot has been identified around the region 2507, and device level cells of the region 2507 have been modified to include device level cells that have different sizes, arrangements and/or configurations. As shown in Stage 3, the region 2507 has been changed to a region 207 that includes device level cells with different sizes, arrangements and/or configurations. As a result, some of the device level cells in the region 207 are no longer standard device level cells. It is noted that not all standard device level cells of the region 207 are modified or have to be modified.

Stage 3 illustrates that the region 2507 includes a device level cell 2517a, a device level cell 2517b, and a device level cell 2517c. Stage 3 further illustrates that the device level cell 2517a has been modified to a device level cell 270, and the device level cell 2517b has been removed. The device level cell 2517c remains the same, but is now labeled as device level cell 272. As a result, the region 207 includes the device level cell 270 and the device level cell 272. Examples of how device level cells may be modified are illustrated and described in at least FIG. 5. Various models and assumptions may be made to determine which device level cells are modified and how device level cells are modified.

Stage 4 illustrates a state after at least one potential hot spot has been identified around the region 2509, and device level cells of the region 2509 have been modified to include device level cells that have different sizes, arrangements and/or configurations. As shown in Stage 4, the region 2509 has been changed to a region 209 that includes device level cells with different sizes, arrangements and/or configurations. As a result, some of the device level cells in the region 209 are no longer standard device level cells. It is noted that not all standard device level cells of the region 209 are modified or have to be modified.

Stage 4 illustrates that the region 2509 includes a device level cell 2519a, a device level cell 2519b, and a device level cell 2519c. Stage 4 further illustrates that the device level cell 2519a has been modified to a device level cell 290, and the device level cell 2519b has been removed. The device level cell 2519c remains the same, but is now labeled as device level cell 292. As a result, the region 209 includes the device level cell 270 and the device level cell 272. In some implementations, the device level cell 290 is aligned along a different direction and/or axis than other device level cells (e.g., device level cell 270). Examples of how device level cells may be modified are illustrated and described in at least FIG. 5. Various models and assumptions may be made to determine which device level cells are modified and how device level cells are modified.

It is noted that the modification of the device level cells may be made on a region by region basis, a cell by cell basis, a device level cell by device level cell basis, or combinations thereof. In some implementations, several iterations may be performed to optimize how one or more regions with hotspots are modified.

Stage 4 illustrates an example of a layout (e.g., integrated device layout, design layer) that includes device level cells (e.g., standard device level cells, modified device level cells). The layout may be a physical layout across a cross section of an integrated device. The layout may represent a design layout of an integrated device, where the design layout is stored in processor readable medium (e.g., non-transitory processor readable medium). The design layout may be stored in a Graphic Data System (GDS) format file (e.g., GDSII). However, other file formats may be used to store the design layout. In some implementations, the design layout is stored in a binary file format, and includes planar geometric shapes, labels and other information about the layout of the integrated device in a hierarchical form. In some implementations, a fabrication entity (e.g., foundry) may use the design layout (which may be stored in a GDSII file) to fabricate an integrated device that includes the layout. In some implementations, before the layout is stored in a file, a signoff process is performed where device levels that need to be modified are replaced with device level cells that have been pre-designed with particular designs.

In some implementations, modifying the device level cells may include changing the configuration, the size, the length, the spacing of the device level cells, its active components (e.g., STI, active device, FinFET, OD) and/or the number of active components. In some implementations, modifying the device level cells may include replacing, removing and/or moving one or more device level cells. In some implementations, modifying the device level cells may include specifying the device level cell as being a dummy device level cell and/or specifying a dummy metal layer over the device level cell.

FIG. 26 illustrates two different temperature distribution models for a region of an integrated device. The temperature distribution model on the left is for a region that only include standard device level cells. The temperature distribution model on the right is for a region that includes device level cells that have been modified. As shown in FIG. 26, the region (on the left) that only include standard device level cells, there is a temperature rise of about X, while under the same or similar condition, the region (on the right) which includes modified device level cells, there is a temperature rise of about 0.48X. Thus, in this example, the modification of the device level cells results in a reduction of the temperature rise. In addition, the region on the right (which includes modified device level cells) has a more even distribution of the temperature relative to the region on the left (without modified device level cells). It is noted that FIG. 26 is merely an example of temperature distribution models. However, FIG. 26 illustrates how using modified device level cells (e.g., non-standard device level cells) helps improve heat dissipation. Different implementations may have different temperature distribution models with different temperature rises and/or different temperature distributions.

Figure 27:
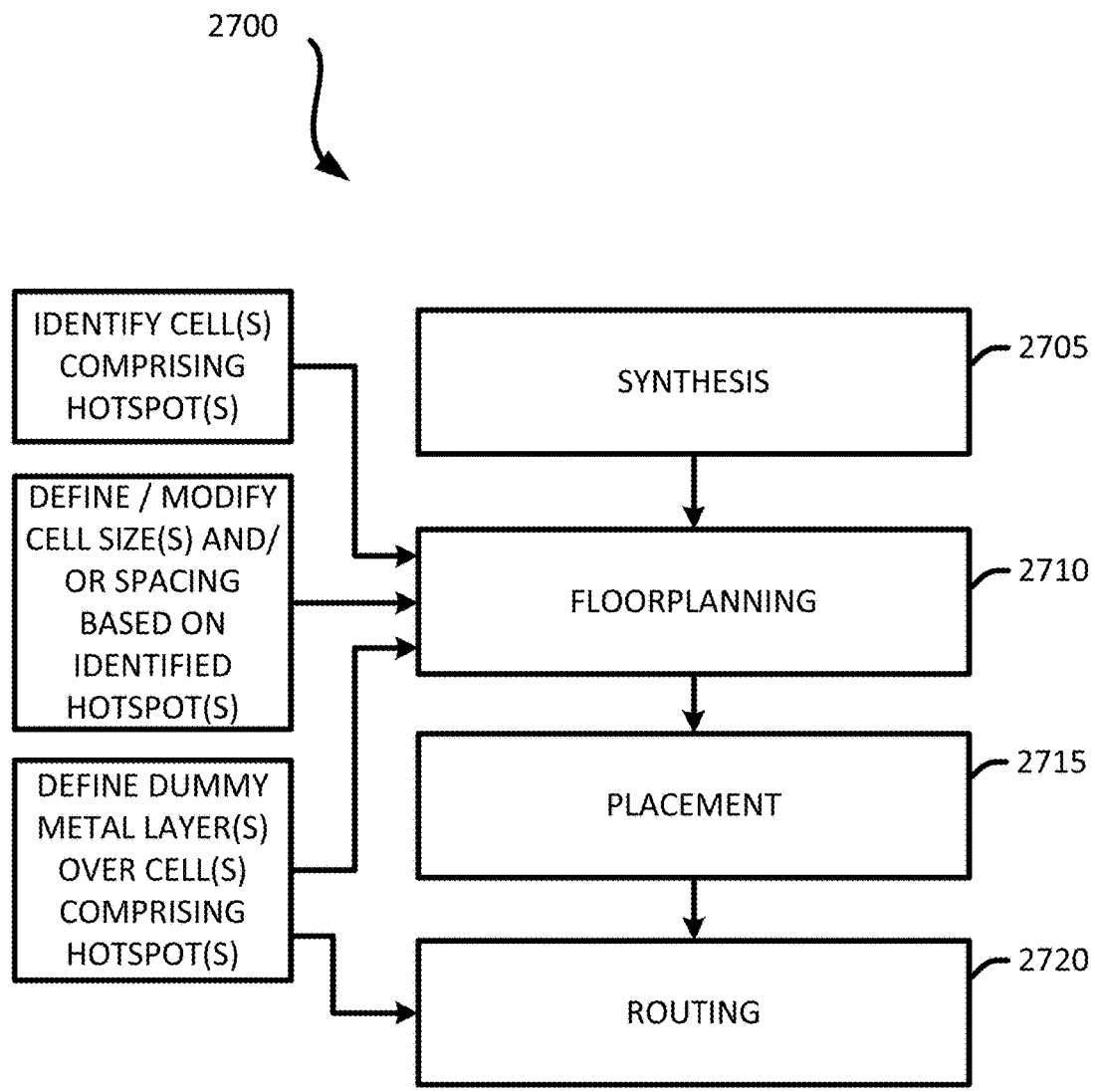
FIG. 27 illustrates an exemplary flow diagram of a method for modifying the size of one or more device level cells of an integrated device.

Exemplary Flow Diagram of a Method for Designing and Modifying the Size of Device Level Cells Around Hotspots of an Integrated Device In some implementations, designing and modifying the location and/or configuration (e.g., size) of device level cells over hotspots includes several processes. FIG. 27 illustrates an exemplary flow diagram of a method 2700 for designing and modifying the location and/or configuration (e.g., size) of device level cells over hotspots. In some implementations, the method 2700 of FIG. 27 may be used to design the integrated devices of FIG. 27 and/or other integrated devices described in the present disclosure.

It should be noted that the sequence of FIG. 27 may combine one or more processes in order to simplify and/or clarify the method for designing and modifying the location and/or configuration (e.g., size) of device level cells over hotspots. In some implementations, the order of the processes may be changed or modified. It is noted that FIG. 27 illustrates only part of the process of designing an integrated device. There are other parts of designing an integrated device, which are not shown for purpose of clarity. There other parts of designing an integrated device are well known to a person of ordinary skill and art. In some implementations, FIG. 27 illustrates a process for the physical design of an integrated device.

The method performs (at 2705) a synthesis process, where abstract behavior of a circuit (e.g., as defined at register transfer level (RTL)) is transformed into a design implementation that includes logic gates, which capture logic operations.

The method performs (at 2710) floor planning, which provide a tentative placement of major functional blocks of an integrated device. During floor planning, a layout of the integrated device may be subdivided into partitions and major functional blocks may be positions in one of these partitions. In some implementations, standard device level cells may be specified for the design layout of the integrated device during floor planning process.

Once the major functional blocks have been positioned, then a simulation may be run to identify potential hotspots and/or hotspot regions. Different simulations may use different assumptions and/or models to identify potential hotpots and/or hotspot regions. As mentioned above, a hotspot may be identified differently for different implementations. Examples of what may constitute a hotspot and/or hotspot region are described above with respect to at least FIG. 5.

After the potential hotpots have been identified, then device level cells that are about (e.g., near, around, above) the identified hotspot(s) are modified to have a different configuration, a different size, a different length, a different spacing and/or a different arrangement in order to provide improved heat dissipation. In some implementations, modifying a device level cell may include moving the device level cell, removing the device level cell, replacing the device level cell. In some implementations, a dummy metal layer may be specified over the modified device level cell. In some implementations, the identified device level cells may be marked so that during a different process (e.g., routing), one or more dummy metal layers may be specified.

The method performs (at 2715) placement, which provides detailed and exact locations for the components of the circuits. The end result is a placement layout that includes the locations of all the components of the circuits are located.

The method performs (at 2720) routing, which provides how components of the circuit are coupled to the each other. In some implementations, routing includes specifying how the logic gates are coupled to each other in the interconnect portion of an integrated device. In some implementations, during the routing, the method may specify dummy metal layer(s) over one or more device level cells that has been specified as being around and/or about a hotspot.

It is noted that in some implementations, even if a potential hotspot is identified, one or more device level cells may not necessarily be modified. For example, one or more device level cells may be left as a standard device level cell, even if the device level cells are around a potential hotspot and/or potential hotspot region. This may be the case when the potential hotspot is slightly above a threshold value. For example, if the threshold value for a potential hotspot is 95 degrees Celsius, and the potential hotspot has been identified as having a temperature of 96 degrees Celsius, then only a few of the device level cells may be modified, in order to reduce the temperature around the potential hotspot. On the other hand, if the potential hotspot has been identified as having a temperature that is substantially above the threshold value (e.g., having a temperature that is at least 20 degrees Celsius above the threshold value), then at least a majority of the device level cells may be modified. The approach described in the disclosure provides a balance approach to improved heat dissipation while minimizing how many device level cells are modified, which in turns minimizes the size and form factor of the integrated device.

The method may perform additional process for designing and modifying at least one device level cells for an integrated device. It is also noted that in some implementations, the process of identifying potential hotpots and modifying device level cells may be performed during different stages of the design process of an integrated device.

Exemplary Electronic Devices

Figure 28:
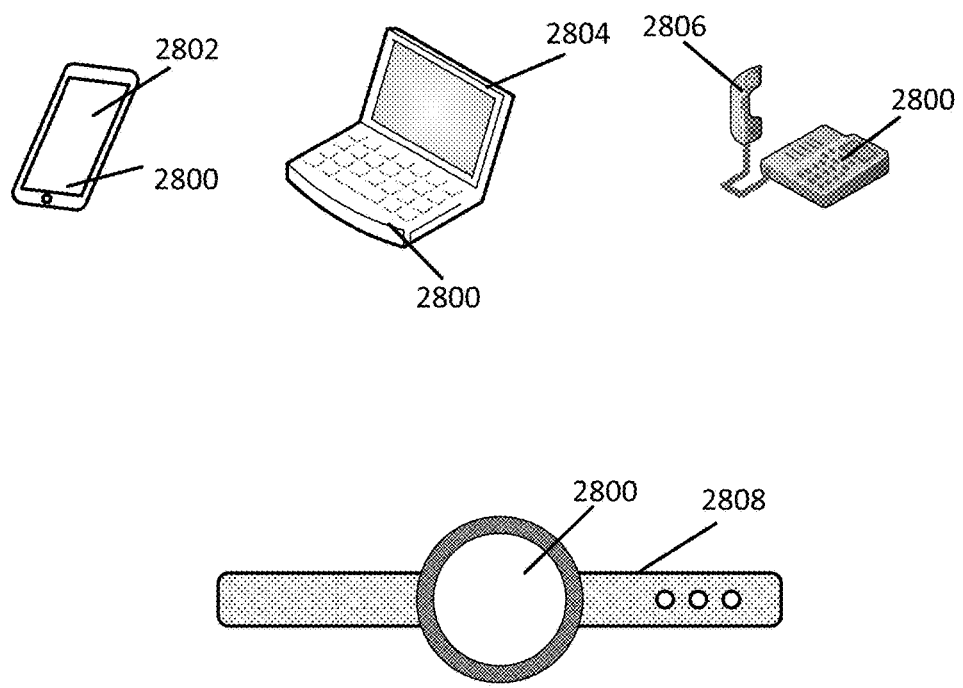
FIG. 28 illustrates various electronic devices that may integrate a die, an integrated device, an integrated passive device (IPD), a device package, a package, an integrated circuit and/or PCB described herein.

FIG. 28 illustrates various electronic devices that may be integrated with any of the aforementioned device, integrated device, integrated circuit (IC) package, integrated circuit (IC) device, semiconductor device, integrated circuit, die, interposer, package or package-on-package (PoP). For example, a mobile phone device 2802, a laptop computer device 2804, a fixed location terminal device 2806, or a wearable device 2808 may include a device 2800 as described herein. The device 2800 may be, for example, any of the devices and/or integrated circuit (IC) packages described herein. The devices 2802, 2804, 2806 and 2808 illustrated in FIG. 28 are merely exemplary. Other electronic devices may also feature the device 2800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-22, 23A-23B, 24, 25A-25B and/or 26-28 may be rearranged and/or combined into a single component, process, feature or function or embodied in several components, processes, or functions. Additional elements, components, processes, and/or functions may also be added without departing from the disclosure. It should also be noted FIGS. 2-22, 23A-23B, 24, 25A-25B and/or 26-28 and its corresponding description in the present disclosure is not limited to dies and/or ICs. In some implementations, FIGS. 2-22, 23A-23B, 24, 25A-25B and/or 26-28 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
  a substrate;
  a device level layer over the substrate, the device level layer including:
    a plurality of first device level cells, each first device level cell including a first configuration, wherein the plurality of first device level cells includes standard device level cells that represent at least about 90 percent of all device level cells of the integrated device; and
    a plurality of second device level cells, at least one second device level cell including a second configuration that is different than the first configuration, wherein the plurality of second device level cells is located over at least one region of the integrated device that includes at least one hotspot; and
  an interconnect portion over the device level layer.

2. The integrated device of claim 1, wherein the at least one hotspot is defined as a region of the integrated device that has a temperature of at least about 95 degrees Celsius (C) when the integrated device is operating.

3. The integrated device of claim 1, further comprising a plurality of regions, each region is associated with a particular temperature when the integrated device is operating, wherein the at least one hotspot is defined as a region of the integrated device that has a temperature that is at least about in the $95^{th}$ percentile of temperatures for the plurality of regions.

4. The integrated device of claim 3, wherein each region comprises a first device level cell and/or a second device level cell, the particular temperature of the region is defined as a representative temperature for at least a majority of device level cells located in the region.

5. The integrated device of claim 1, wherein at least one second device level cell from the plurality of second device level cells comprises a third configuration that is different than the first configuration and the second configuration.

6. The integrated device of claim 5, wherein at least one second device level cell from the plurality of second device level cells comprises the first configuration.

7. The integrated device of claim 5, wherein the first configuration comprises a first width and/or a first length.

8. The integrated device of claim 1, wherein the first configuration of the first device level cell is defined by a distance between two first shallow trench isolation (STIs).

9. The integrated device of claim 8, wherein the second configuration of the second device level cell is defined by a distance between two second first shallow trench isolation (STIs).

10. The integrated device of claim 1, further comprising a dummy metal layer over at least one second device level cell, the dummy metal layer formed in the interconnect portion of the integrated device.

11. The integrated device of claim 1, wherein the second device level cell comprises a dummy device level cell.

12. The integrated device of claim 1, wherein the plurality of second device level cells are non-standard level cells that are located within about 20 micrometers (μm) of one or more hotspots of the integrated device.

13. The integrated device of claim 1, wherein a majority of the plurality of second device level cells are located about one or more hotspots of the integrated device.

14. The integrated device of claim 1, wherein the plurality of first device level cells are standard device level cells that represent between about 90 percent and 99.999 percent of all device level cells of the integrated device.

15. The integrated device of claim 1, wherein the integrated device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

16. A design layout for an integrated device, comprising:
a plurality of first device level cells, each first device level cell including a first configuration, wherein the plurality of first device level cells includes standard device level cells that represent at least about 90 percent of all device level cells of the integrated device; and
a plurality of second device level cells, at least one second device level cell including a second configuration that is different than the first configuration, wherein the plurality of second device level cells is located over at least one region of the integrated device that includes at least one hotspot.

17. The design layout for an integrated device of claim 16, wherein the plurality of second device level cells are non-standard level cells that are located about one or more hotspots of the integrated device.

18. The design layout for an integrated device of claim 16, wherein a majority of the plurality of second device level cells are located about one or more hotspots of the integrated device.

19. The design layout for an integrated device of claim 16, wherein the plurality of first device level cells are standard device level cells that represent between about 90 percent and 99.999 percent of all device level cells of the integrated device.

20. The design layout for an integrated device of claim 16, wherein the at least one hotspot is defined as a region of the integrated device that has a temperature of at least about 95 degrees Celsius (C) when the integrated device is operating.

21. The design layout for an integrated device of claim 16, further comprising a plurality of regions, each region is associated with a particular temperature when the integrated device is operating, wherein the at least one hotspot is defined as a region of the integrated device that has a temperature that is at least about in the 95$^{th}$ percentile of temperatures for the plurality of regions.

22. The design layout for an integrated device of claim 21, wherein each region comprises a first device level cell and/or a second device level cell, the particular temperature of the region is defined as a representative temperature for at least a majority of device level cells located in the region.

23. The design layout for an integrated device of claim 16, further comprising a dummy metal layer over at least one second device level cell.

24. The design layout for an integrated device of claim 16, wherein the second device level cell comprises a dummy device level cell.

25. A method for specifying a design layout for an integrated device, comprising
specifying a plurality of standard device level cells for the integrated device;
identifying one or more potential hotpots of the integrated device; and
replacing one of more standard device level cells around the identified potential hotpots with one or more modified device level cells.

26. The method of claim 25, wherein specifying a plurality of standard device level cells for the integrated device, identifying one or more potential hotpots of the integrated device and replacing one of more standard device level cells around the identified potential hotpots with one or more modified device level cells, are performed during a floor planning process of the integrated device design process.

27. The method of claim 25, wherein replacing one of more standard device level cells around the identified potential hotpots with one or more modified device level cells comprises replacing one of more standard device level cells around the identified potential hotpots with one or more dummy device level cells.

28. The method of claim 25, further comprising specifying a dummy metal layer over the modified device level cell.

29. The integrated device of claim 1, wherein the at least one hotspot includes a region that that been identified as a potential hotspot for the integrated device, when the integrated device is operating.

30. The design layout of an integrated device of claim 16, wherein the at least one hotspot includes a region that that been identified as a potential hotspot for the integrated device, when the integrated device is operating.

31. An integrated device comprising:
a substrate;
a device level layer over the substrate, the device level layer including:
a plurality of first device level cells, each first device level cell including a first configuration; and
a plurality of second device level cells, at least one second device level cell including a second configuration that is different than the first configuration, at least one second device level cell includes a dummy device level cell, wherein the plurality of second device level cells is located over at least one region of the integrated device that includes at least one hotspot; and
an interconnect portion over the device level layer.

32. The integrated device of claim 31, further comprising a dummy metal layer over at least one dummy device level cell, the dummy metal layer formed in the interconnect portion of the integrated device.

33. The integrated device of claim 31, wherein the dummy device level cell is a device level cell that is not electrically coupled to a circuit of the integrated device.

34. The integrated device of claim 31, wherein the dummy device level cell includes a dummy gate.

* * * * *